(12) United States Patent
Lee et al.

(10) Patent No.: US 10,644,106 B2
(45) Date of Patent: May 5, 2020

(54) SEMICONDUCTOR DEVICE

(71) Applicant: Samsung Electronics Co., Ltd., Suwon-si (KR)

(72) Inventors: Choeun Lee, Pocheon-si (KR); Seokhoon Kim, Suwon-si (KR); Sanggil Lee, Ansan-si (KR); Seung Hun Lee, Hwaseong-si (KR); Min-Hee Choi, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/138,064

(22) Filed: Sep. 21, 2018

(65) Prior Publication Data

US 2019/0181225 A1 Jun. 13, 2019

(30) Foreign Application Priority Data

Dec. 7, 2017 (KR) .................. 10-2017-0167673

(51) Int. Cl.
*H01L 29/08* (2006.01)
*H01L 29/165* (2006.01)
(Continued)

(52) U.S. Cl.
CPC .... *H01L 29/0847* (2013.01); *H01L 21/02532* (2013.01); *H01L 21/02636* (2013.01); *H01L 21/308* (2013.01); *H01L 21/823814* (2013.01); *H01L 21/823821* (2013.01); *H01L 21/823864* (2013.01); *H01L 27/092* (2013.01); *H01L 27/1104* (2013.01); *H01L 29/045* (2013.01); *H01L 29/0673* (2013.01); *H01L 29/1037* (2013.01); *H01L 29/165* (2013.01); *H01L 29/42392* (2013.01); *H01L 29/66545* (2013.01); *H01L 29/66636* (2013.01); *H01L 29/66772* (2013.01); *H01L 29/66795* (2013.01); *H01L 29/7848* (2013.01); *H01L 29/7853* (2013.01); *H01L 29/78618* (2013.01); *H01L 29/78696* (2013.01); *H01L 21/02579* (2013.01); *H01L 21/3065* (2013.01); *H01L 21/30604* (2013.01);
(Continued)

(58) Field of Classification Search
None
See application file for complete search history.

(56) References Cited

U.S. PATENT DOCUMENTS 8,975,144 B2 3/2015 Kwok et al.
9,431,536 B1 8/2016 Wu et al.
(Continued)

*Primary Examiner* — Michelle Mandala
(74) *Attorney, Agent, or Firm* — Muir Patent Law, PLLC

(57) ABSTRACT

Disclosed is a semiconductor device that comprises a substrate including a first active pattern vertically protruding from a top surface of the substrate, and a first source/drain pattern filing a first recess formed on an upper portion of the first active pattern. The first source/drain pattern comprises a first semiconductor pattern and a second semiconductor pattern on the first semiconductor pattern. The first semiconductor pattern has a first face, a second face, and a first corner edge defined when the first face and the second face meet with each other. The second semiconductor pattern covers the first face and the second face of the first semiconductor pattern and exposes the first corner edge.

20 Claims, 41 Drawing Sheets

(51) Int. Cl.
*H01L 29/04* (2006.01)
*H01L 27/11* (2006.01)
*H01L 29/78* (2006.01)
*H01L 29/06* (2006.01)
*H01L 21/8238* (2006.01)
*H01L 21/308* (2006.01)
*H01L 21/02* (2006.01)
*H01L 29/66* (2006.01)
*H01L 29/10* (2006.01)
*H01L 29/423* (2006.01)
*H01L 29/786* (2006.01)
*H01L 27/092* (2006.01)
*H01L 21/3105* (2006.01)
*H01L 29/167* (2006.01)
*H01L 21/3065* (2006.01)
*H01L 21/306* (2006.01)
*H01L 29/161* (2006.01)

(52) U.S. Cl.
CPC .... *H01L 21/31053* (2013.01); *H01L 29/0653* (2013.01); *H01L 29/161* (2013.01); *H01L 29/167* (2013.01)

(56) References Cited

U.S. PATENT DOCUMENTS

| | | |
|---|---|---|
| 9,530,661 B2 | 12/2016 | Kim et al. |
| 9,761,719 B2 | 9/2017 | Kim et al. |
| 9,793,404 B2 | 10/2017 | Sung et al. |
| 9,837,511 B2 | 12/2017 | Tung et al. |
| 2015/0170916 A1 | 6/2015 | Yu et al. |
| 2015/0380553 A1* | 12/2015 | Park ............... H01L 29/7848 257/190 |
| 2017/0148798 A1 | 5/2017 | Basker et al. |
| 2017/0162582 A1 | 6/2017 | Pranatharthiharan et al. |
| 2017/0243791 A1* | 8/2017 | Jacob ............. H01L 21/02447 |
| 2019/0164835 A1* | 5/2019 | Lu ................. H01L 21/02573 |

* cited by examiner

SEMICONDUCTOR DEVICE

CROSS-REFERENCE TO RELATED APPLICATIONS

This U.S. nonprovisional application claims priority under 35 U.S.C § 119 to Korean Patent Application No. 10-2017-0167673 filed on Dec. 7, 2017, in the Korean Intellectual Property Office, the entire contents of which are hereby incorporated by reference.

BACKGROUND

The present disclosure relates to a semiconductor device, and more particularly, to a semiconductor device including field effect transistors.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and integrated to meet these requested characteristics.

SUMMARY

Embodiments disclosed herein provide a semiconductor device with enhanced electrical characteristics and improved integration.

According to exemplary embodiments, a semiconductor device may comprise: a substrate including a first active pattern vertically protruding from a top surface of the substrate; and a first source/drain pattern filing a first recess formed on an upper portion of the first active pattern. The first source/drain pattern may comprise: a first semiconductor pattern; and a second semiconductor pattern on the first semiconductor pattern. The first semiconductor pattern may have a first face, a second face, and a first corner edge defined where the first face and the second face meet with each other. The second semiconductor pattern may cover the first face and the second face of the first semiconductor pattern and expose the first corner edge.

According to exemplary embodiments, a semiconductor device may comprise: a substrate including a first active pattern vertically protruding from a top surface of the substrate; and a first source/drain pattern filing a first recess formed on an upper portion of the first active pattern. The first source/drain pattern may have a first face perpendicular to the top surface of the substrate. The first source/drain pattern may comprise a first semiconductor pattern and a second semiconductor pattern on the first semiconductor pattern. The first semiconductor pattern may comprise a first corner edge horizontally protruding in a direction away from a center of the first source/drain pattern and located between portions of the second semiconductor pattern. The first corner edge of the first semiconductor pattern may be located at the first face of the first source/drain pattern.

According to exemplary embodiments, a semiconductor device may comprise a memory cell on a substrate. The memory cell may comprise: first and second access transistors; first and second pull-up transistors; and first and second pull-down transistors. A first source/drain pattern of the first pull-up transistor may be spaced apart in a first direction from a second source/drain pattern of the first pull-down transistor. The first source/drain pattern may have a first face facing the second source/drain pattern. The first face of the first source/drain pattern may be perpendicular to a top surface of the substrate.

DETAILED DESCRIPTION

Figure 1:
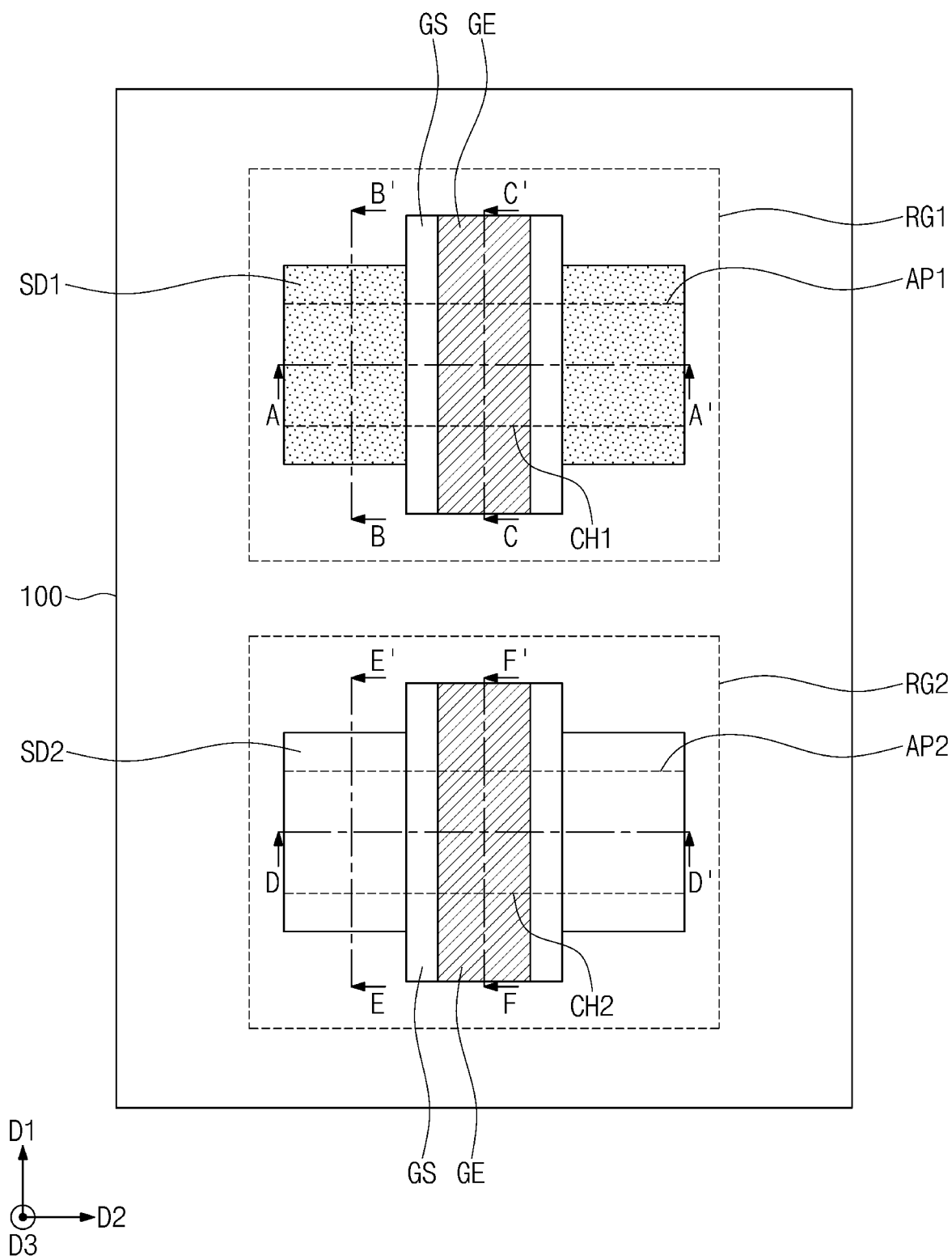
FIG. 1 illustrates a plan view showing a semiconductor device according to exemplary embodiments.
Figure 2A:
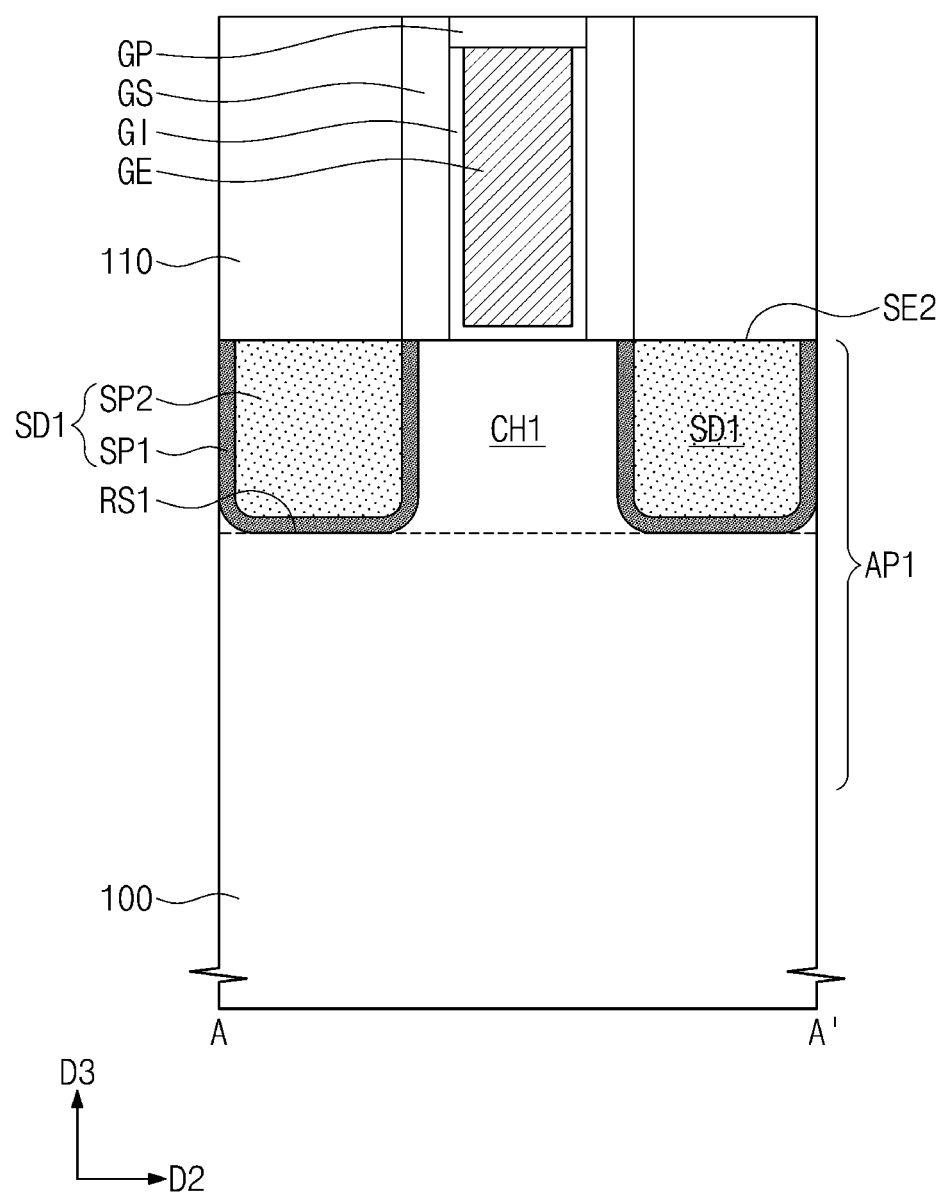
FIGS. 2A to 2F illustrate cross-sectional views respectively taken along lines A-A', B-B', C-C', D-D', E-E', and F-F' of FIG. 1.
Figure 2B:
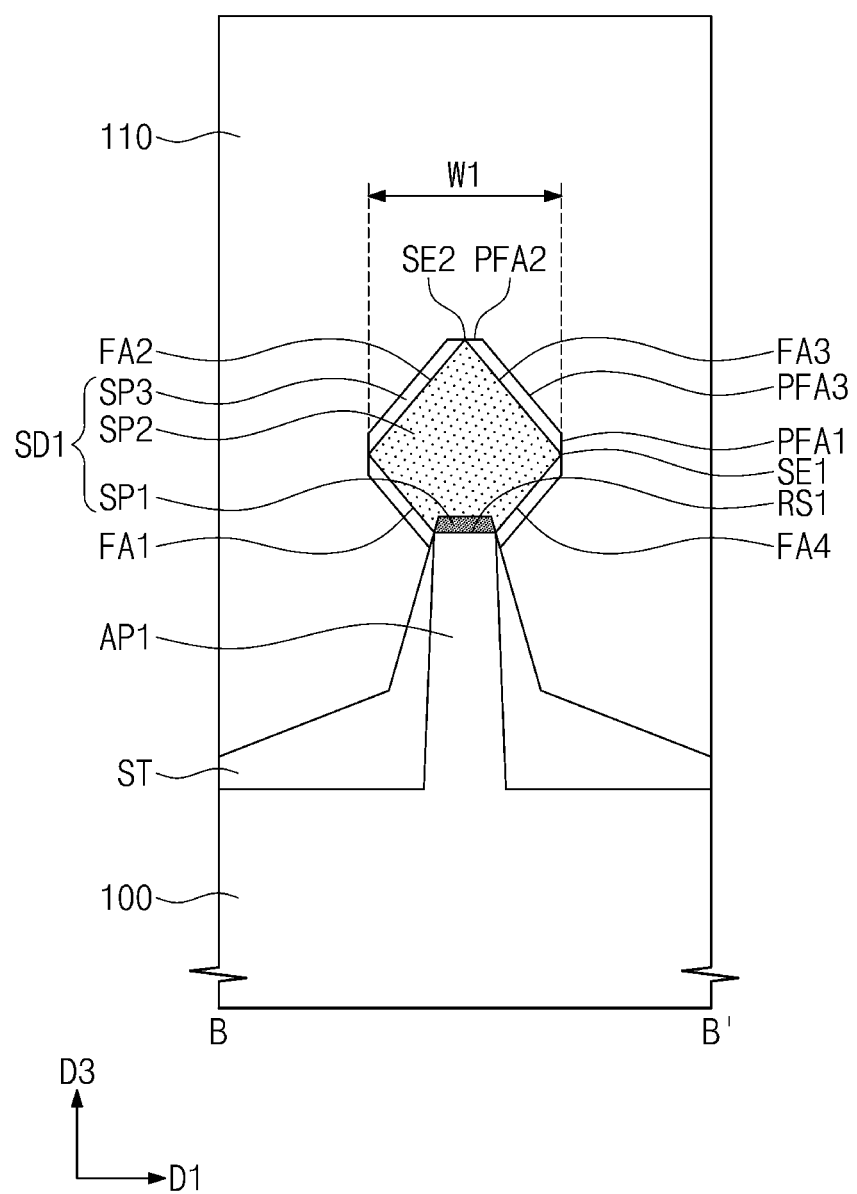
Figure 2C:
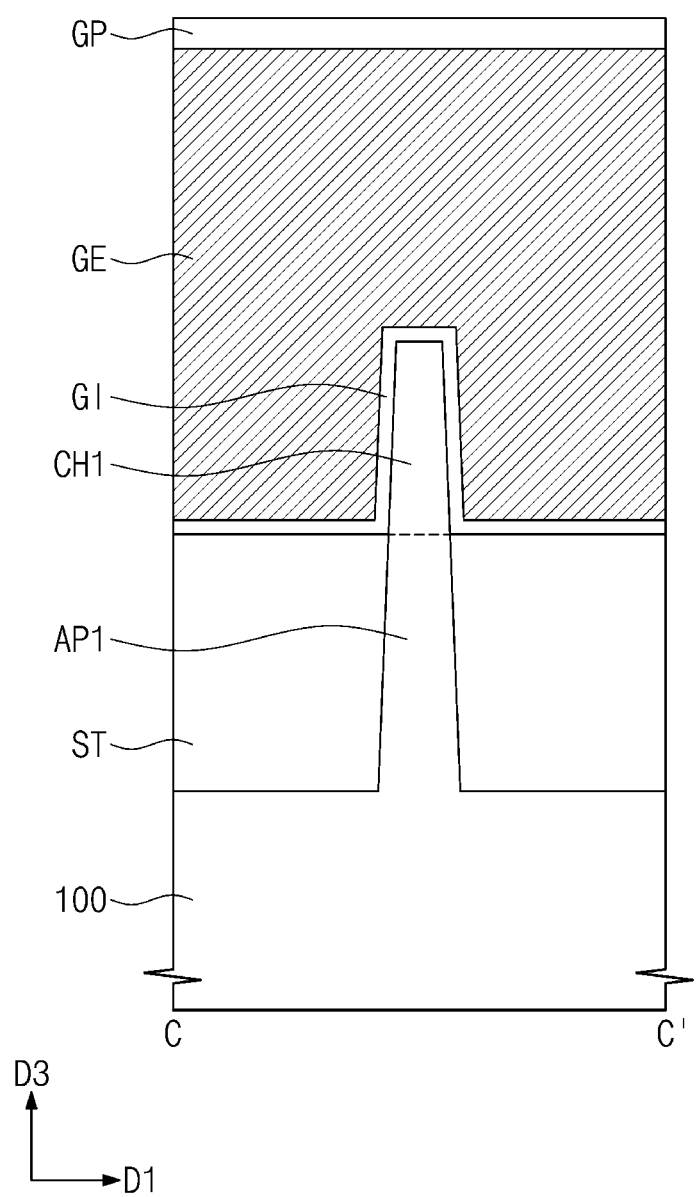
Figure 2D:
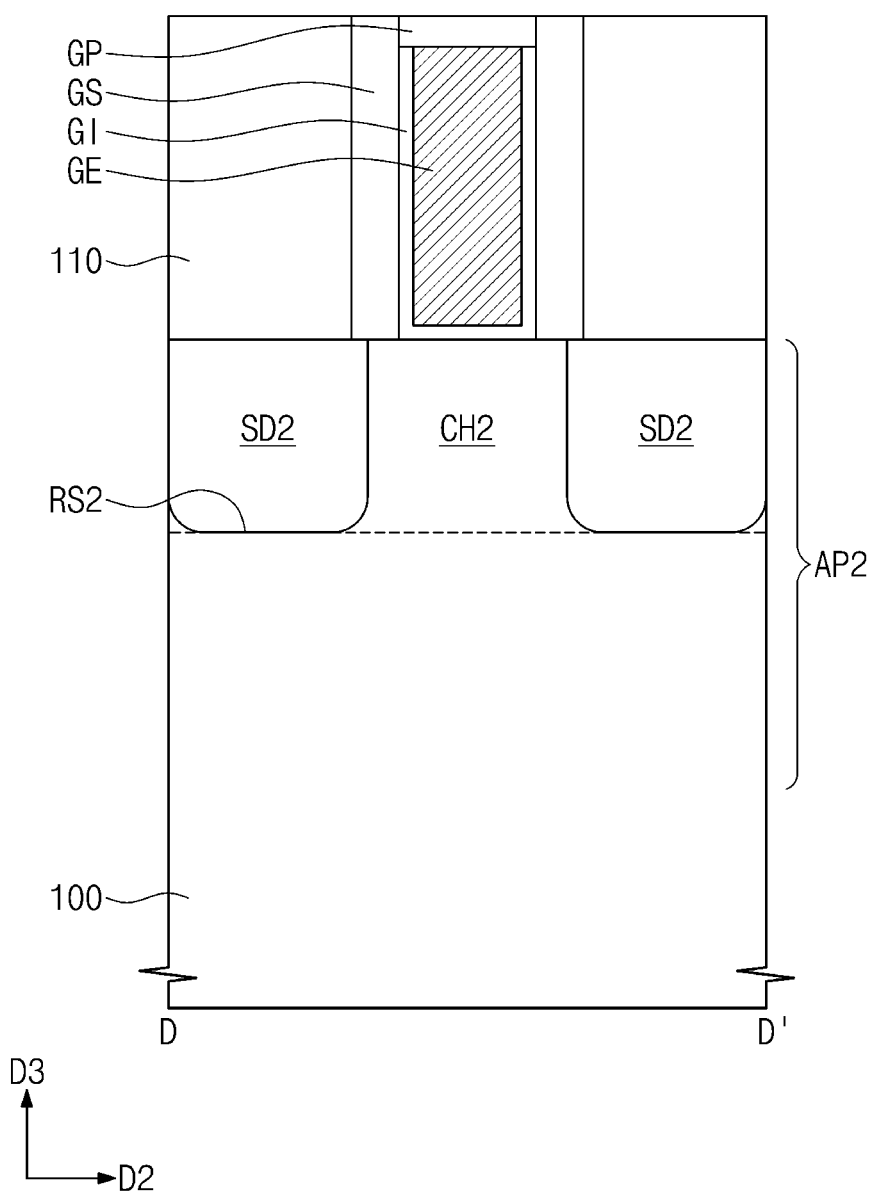
Figure 2E:
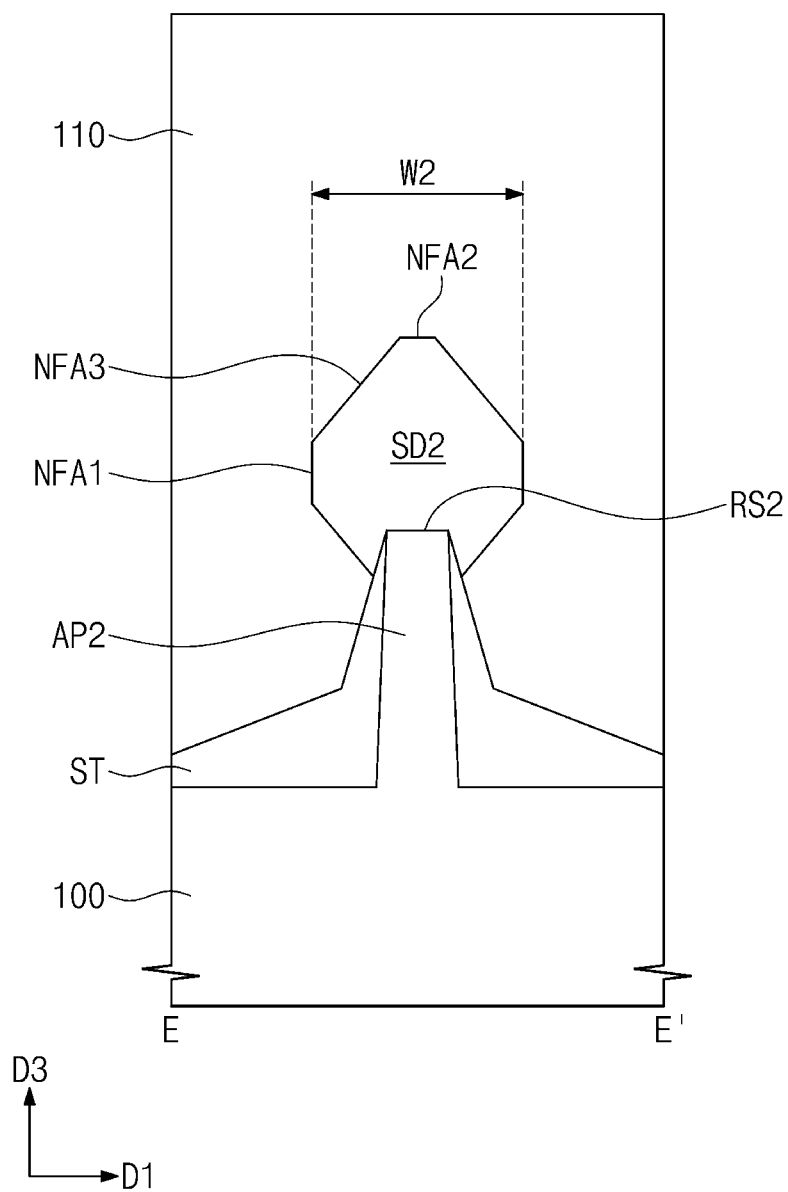
Figure 2F:
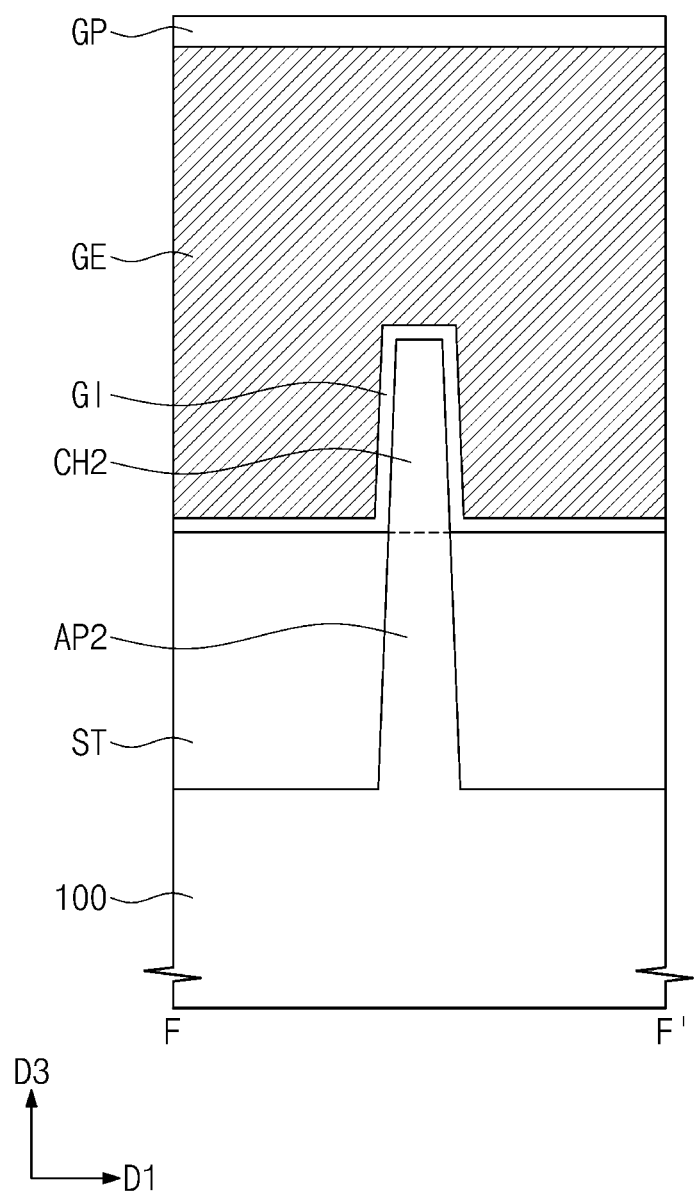

FIG. 1 illustrates a plan view showing a semiconductor device according to exemplary embodiments of inventive concepts. The semiconductor device may be, for example, a semiconductor chip formed from a die of a wafer (e.g., memory or logic chip), or a semiconductor package, either of which includes the components described in FIGS. 1 and 2A-2F. FIGS. 2A to 2F illustrate cross-sectional views respectively taken along lines A-A', B-B', C-C', D-D', E-E', and F-F' of FIG. 1.

Referring to FIGS. 1 and 2A to 2F, a substrate 100 may include a first region RG1 and a second region RG2. The first region RG1 and the second region RG2 may be separated from each other on the substrate 100. The substrate 100 may be a compound semiconductor substrate or a semiconductor substrate including silicon, germanium, silicon-germanium, or the like. For example, the substrate 100 may be a silicon substrate.

Each of the first and second regions RG1 and RG2 may be a portion of a logic cell region where logic transistors are disposed to constitute a logic circuit of a semiconductor device. For example, the logic cell region of the substrate 100 may be provided thereon with logic transistors constituting a processor core or an I/O terminal. Each of the first and second regions RG1 and RG2 may include portions of one or more logic transistors or may include individual ones of the logic transistors.

Alternatively, each of the first and second regions RG1 and RG2 may be a portion of a memory cell region for storing data. For example, the memory cell region of the substrate 100 may be provided thereon with memory cell transistors constituting a plurality of SRAM cells. Each of first and second regions RG1 and RG2 may include individual ones of the memory cell transistors. The disclosed embodiments, however, are not limited thereto.

The first region RG1 may be provided thereon with a first active pattern AP1 extending in a second direction D2. The second region RG2 may be provided thereon with a second active pattern AP2 extending in the second direction D2. The first and second active patterns AP1 and AP2 may be portions of the substrate 100 that protrude from a top surface of the substrate 100.

A device isolation layer ST may be provided on an upper portion of the substrate 100. The device isolation layer ST may define the first and second active patterns AP1 and AP2. The device isolation layer ST may directly cover lower sidewalls of each of the first and second active patterns AP1 and AP2. The device isolation layer ST may include an insulating material, such as a silicon oxide layer.

The first and second active patterns AP1 and AP2 may have upper portions higher than a top surface of the device isolation layer ST. The upper portions of the first and second active patterns AP1 and AP2 may vertically protrude over the device isolation layer ST. Each of the upper portions of the first and second active patterns AP1 and AP2 may be shaped like a fin protruding through the device isolation layer ST.

A first channel region CH1 and first source/drain patterns SD1 may be provided on the upper portion of the first active pattern AP1. First recesses RS1 may be formed on the upper portion of the first active pattern AP1. The first recesses RS1 may be recessed lower than the first channel region CH1. The first source/drain patterns SD1 may fill the first recesses RS1. For example, the first source/drain patterns SD1 may be p-type impurity regions. The first channel region CH1 may be interposed between a pair of the first source/drain patterns SD1.

A second channel region CH2 and second source/drain patterns SD2 may be provided on the upper portion of the second active pattern AP2. Second recesses RS2 may be formed on the upper portion of the second active pattern AP2. The second recesses RS2 may be recessed lower than the second channel region CH2. The second source/drain patterns SD2 may fill the second recesses RS2. For example, the second source/drain patterns SD2 may be n-type impurity regions. The second channel region CH2 may be interposed between a pair of the second source/drain patterns SD2.

The first and second source/drain patterns SD1 and SD2 may be epitaxial patterns formed by a selective epitaxial growth process. The first and second source/drain patterns SD1 and SD2 may have top surfaces at a level equal to or higher than those of the first and second channel regions CH1 and CH2. The first source/drain patterns SD1 may include a semiconductor element or material different from that of the substrate 100. For example, the first source/drain patterns SD1 may include a semiconductor element whose lattice constant is greater than that of a semiconductor element of the substrate 100. The first source/drain patterns SD1 may therefore provide the first channel region CH1 with a compressive stress. The second source/drain patterns SD2 may include a semiconductor element whose lattice constant is equal to or less than that of a semiconductor element of the substrate 100. For example, the second source/drain patterns SD2 may include silicon, the same semiconductor element as that of the substrate 100.

Gate electrodes GE may be provided to extend in a first direction D1 while running across the first and second active patterns AP1 and AP2. The gate electrode GE on the first active pattern AP1 may vertically overlap the first channel region CH1. The gate electrode GE on the first active pattern AP1 may surround the top surface and opposite sidewalls of the first channel region CH1 (see FIG. 2C). The gate electrode GE on the second active pattern AP2 may vertically overlap the second channel region CH2. The gate electrode GE on the second active pattern AP2 may surround the top surface and opposite sidewalls of the second channel region CH2 (see FIG. 2F). For example, the gate electrodes GE may include one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each of the gate electrodes GE. The gate spacers GS may extend in the first direction D1 along the gate electrodes GE. The gate spacers GS may have top surfaces higher than those of the gate electrodes GE. The top surfaces of the gate spacers GS may be coplanar with that of a first interlayer dielectric layer 110 which will be discussed below. The gate spacers GS may include one or more of SiCN, SiCON, and SiN. Alternatively, each of the gate spacers GS may include a multiple layer consisting of two or more of SiCN, SiCON, and SiN.

Gate dielectric patterns GI may be interposed between the gate electrode GE and the first active pattern AP1 and between the gate electrode GE and the second active pattern AP2. Each of the gate dielectric patterns GI may extend along a bottom surface of each of the gate electrodes GE. Each of the gate dielectric patterns GI may cover the top surface and the opposite sidewalls of each of the first and second channel regions CH1 and CH2. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping patterns GP may extend in the first direction D1 along the gate electrodes GE. The gate capping patterns GP may include a material having an etch selectivity with respect to a first interlayer dielectric layer 110 which will be discussed below. For example, the gate capping patterns GP may include one or more of SiON, SiCN, SiCON, and SiN.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with top surfaces of the gate capping patterns GP and the top surfaces of the gate spacers GS. For example, the first interlayer dielectric layer 110 may include a silicon oxide layer.

Although not shown, contacts may be provided to penetrate the first interlayer dielectric layer 110 to electrically connect with the first and second source/drain patterns SD1 and SD2. Silicide layers may be interposed between the contacts and the first and second source/drain patterns SD1 and SD2. For example, the contacts may be electrically connected through the silicide layers to the first and second source/drain patterns SD1 and SD2. The silicide layers may include metal-silicide.

The first source/drain pattern SD1 will be discussed in detail with reference back to FIGS. 2A and 2B. The first source/drain pattern SD1 may include a first semiconductor pattern SP1, a second semiconductor pattern SP2, and a third semiconductor pattern SP3. The first semiconductor pattern SP1 may cover an inner sidewall of the first recess RS1. The first semiconductor pattern SP1 may have a U shape when viewed in cross-section along the second direction D2 (see FIG. 2A). For example, the first semiconductor pattern SP1 may be conformally formed to have a uniform thickness on the inner sidewall of the first recess RS1.

The second semiconductor pattern SP2 may be provided on the first semiconductor pattern SP1. At least part of the second semiconductor pattern SP2 may cover an inner sidewall of the first semiconductor pattern SP1. The second semiconductor pattern SP2 may fill the first recess RS1. The second semiconductor pattern SP2 may have a volume greater than that of each of the first and third semiconductor patterns SP1 and SP3. The third semiconductor pattern SP3 may be provided on the second semiconductor pattern SP2. The second semiconductor pattern SP2 may have exposed surfaces (or first to fourth faces FA1 to FA4 which will be discussed above) covered with the third semiconductor pattern SP3.

Each of the first and second semiconductor patterns SP1 and SP2 may include a semiconductor element whose lattice constant is greater than that of a semiconductor element of the substrate 100. For example, when the substrate 100 includes silicon (Si), each of the first and second semiconductor patterns SP1 and SP2 may include silicon-germanium (SiGe). Germanium (Ge) may have a lattice constant greater than that of silicon (Si).

The first semiconductor pattern SP1 may serve as a buffer layer interposed between the substrate 100 and the second semiconductor pattern SP2. The first semiconductor pattern SP1 may contain germanium (Ge) whose concentration is relatively low. For example, the first semiconductor pattern SP1 may contain germanium (Ge) whose content is about 15 at % to about 25 at %. The second semiconductor pattern SP2 may contain germanium (Ge) whose content is greater than that of germanium (Ge) contained in the first semiconductor pattern SP1. For example, the second semiconductor pattern SP2 may contain germanium (Ge) whose content is about 25 at % to about 75 at %.

The third semiconductor pattern SP3 may serve as a capping layer for protecting the second semiconductor pattern SP2. The third semiconductor pattern SP3 may include the same semiconductor element as that of the substrate 100. For example, the third semiconductor pattern SP3 may include single crystalline silicon (Si). The third semiconductor pattern SP3 may contain silicon (Si) whose content is about 95 at % to about 100 at %. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The second semiconductor pattern SP2 may include an impurity (e.g., boron) that causes the first source/drain pattern SD1 to have a p-type conductivity. The impurity contained in the second semiconductor pattern SP2 may have a greater content than that of an impurity contained in each of the first and third semiconductor patterns SP1 and SP3.

The first source/drain pattern SD1 shown when viewed in cross-section along the first direction D1 will be discussed in detail with reference back to FIG. 2B. The first source/drain pattern SD1 may include a first face PFA1, a second face PFA2, and a third face PFA3. The third face PFA3 may be positioned between the first face PFA1 and the second face PFA2. For example, the third face PFA3 may connect the first face PFA1 and the second face PFA2 to each other. The first face PFA1, the second face PFA2, and the third face PFA3 may be different crystal planes from each other. For example, the first face PFA1 may be a (110) plane, the second face PFA2 may be a (100) plane, and the third face PFA3 may be a (111) plane. The first face PFA1 may be perpendicular to the top surface of the substrate 100. The second face PFA2 may be parallel to the top surface of the substrate 100.

The first source/drain pattern SD1 may have a polygonal shape including five or more planes. For example, the first source/drain pattern SD1 may include two (110) planes, one (100) plane, and four (111) planes.

The second semiconductor pattern SP2 of the first source/drain patter SD1 may include a first face FA1, a second face FA2, a third face FA3, and a fourth face FA4. The first to fourth faces FA1 to FA4 of the second semiconductor pattern SP2 may be the same crystal plane. The first to fourth faces FA1 to FA4 of the second semiconductor pattern SP2 may all be a (111) plane. For example, the second semiconductor pattern SP2 may include only (111) planes.

A first corner edge SE1 may be defined by the third face FA3 and the fourth face FA4 of the second semiconductor pattern SP2. The first corner edge SE1 may horizontally protrude in a direction away from a center of the second semiconductor pattern SP2. The first corner edge SE1 may protrude in the first direction D1. The first corner edge SE1 may be located at the first face PFA1 of the first source/drain pattern S/D, and may form part of the first face PFA1 of the first source/drain pattern S/D, and may be coplanar with the first face PFA1.

A second corner edge SE2 may be defined by the second face FA2 and the third face FA3 of the second semiconductor pattern SP2. The second corner edge SE2 may vertically protrude in a direction away from the center of the second semiconductor pattern SP2. The second corner edge SE2 may protrude in a third direction D3.

The third semiconductor pattern SP3 may directly cover the first to fourth faces FA1 to FA4 of the second semiconductor pattern SP2. The third semiconductor pattern SP3 may not cover the first and second corner edges SE1 and SE2 of the second semiconductor pattern SP2. The third semiconductor pattern SP3 may expose the first and second corner edges SE1 and SE2 of the second semiconductor pattern SP2. The third semiconductor pattern SP3 may have exposed surfaces corresponding to the first to third faces PFA1 to PFA3 of the first source/drain pattern SD1.

The first source/drain pattern SD1 may have a maximum width W1 in the first direction D1 at a level at which the second semiconductor pattern SP2 has the first corner edge SE1. The maximum width W1 of the first source/drain pattern SD1 may be substantially the same as a maximum width of the second semiconductor pattern SP2. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second source/drain pattern SD2 will be discussed in detail with reference back to FIGS. 2D and 2E. The second source/drain pattern SD2 may include a single semiconductor layer. The second source/drain patterns SD2 may include the same semiconductor element as that of the substrate 100. For example, the second source/drain pattern SD2 may include silicon (Si). The second source/drain pattern SD2 may include an impurity (e.g., phosphorous) that causes the second source/drain pattern SD2 to have an n-type conductivity.

The second source/drain pattern SD2 shown when viewed in cross-section along the first direction D1 will be discussed in detail with reference back to FIG. 2E. The second source/drain pattern SD2 may include a first face NFA1, a second face NFA2, and a third face NFA3. The third face NFA3 may be positioned between the first face NFA1 and the second face NFA2. For example, the third face NFA3 may connect the first face NFA1 and the second face NFA2 to each other. The first face NFA1, the second face NFA2, and the third face NFA3 may be different crystal planes from each other. For example, the first face NFA1 may be a (110) plane, the second face NFA2 may be a (100) plane, and the third face NFA3 may be a (111) plane. The first face NFA1 may be perpendicular to the top surface of the substrate 100. The second face NFA2 may be parallel to the top surface of the substrate 100.

The second source/drain pattern SD2 may have a polygonal shape including five or more planes. For example, the second source/drain pattern SD2 may include two (110) planes, one (100) plane, and four (111) planes. The second source/drain pattern SD2 may have a maximum width W2 in the first direction D1 between the first faces NFA1 that are opposite to each other.

Figure 9:
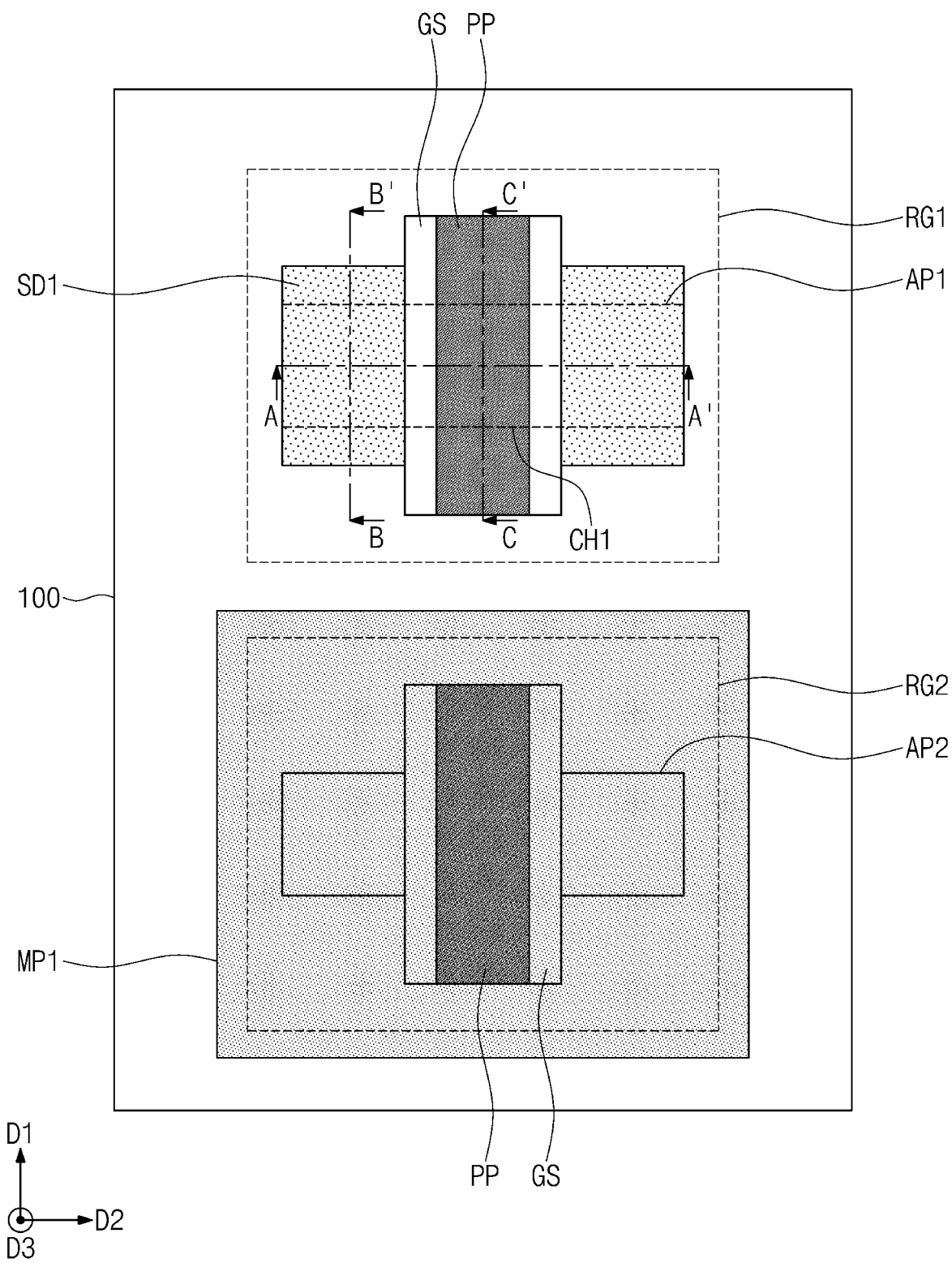
Figure 10A:
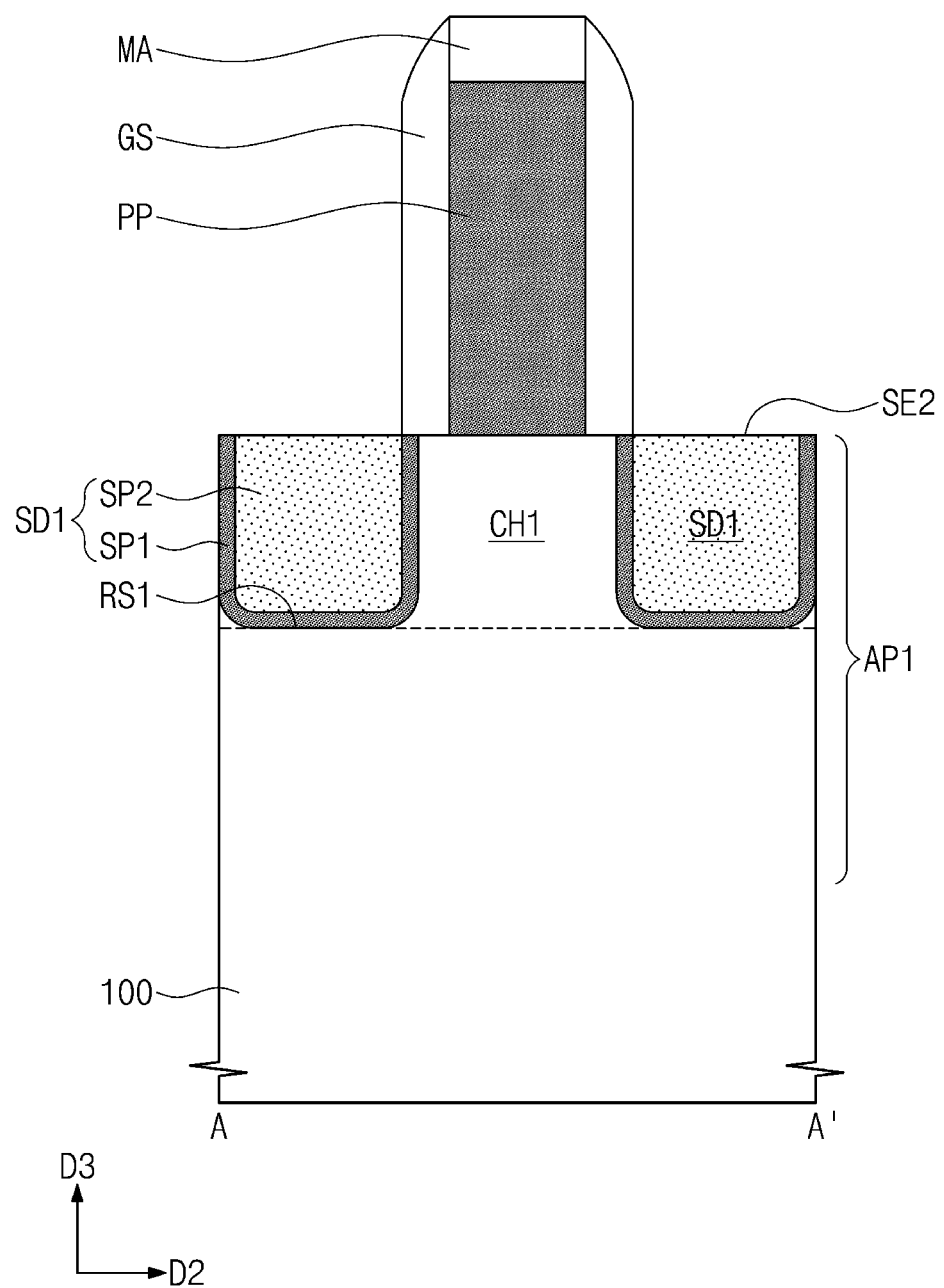
Figure 10B:
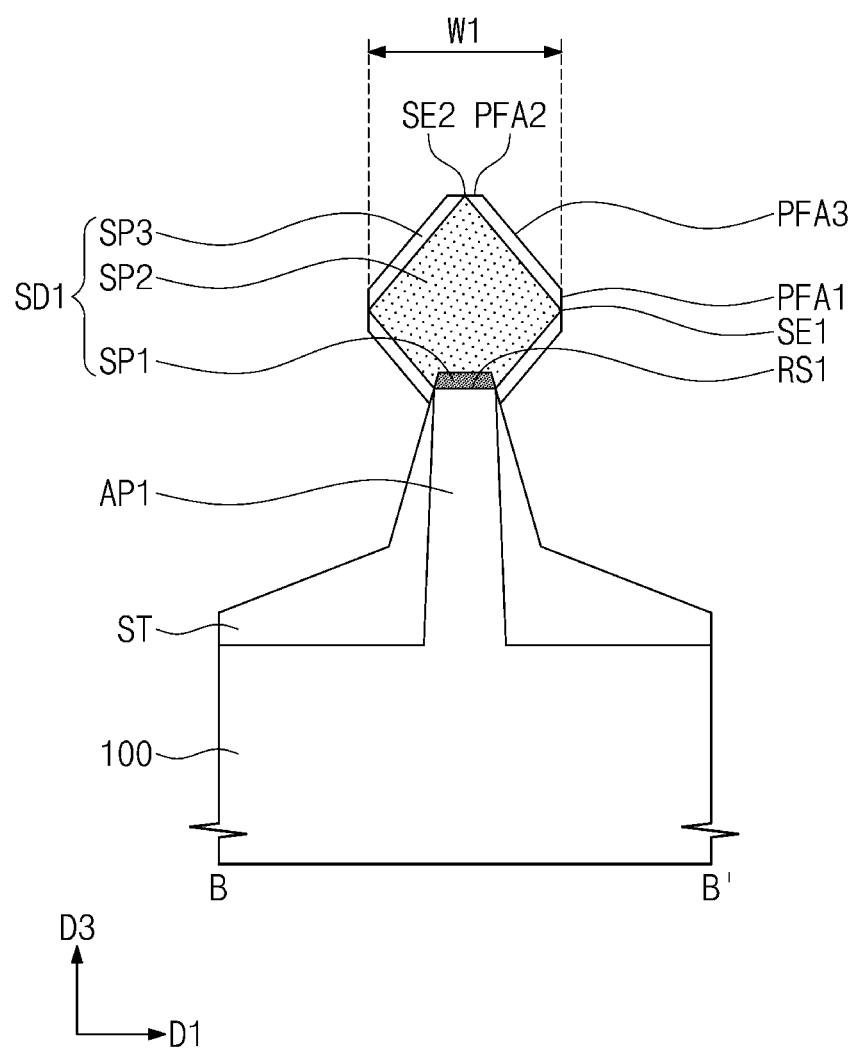
Figure 10C:
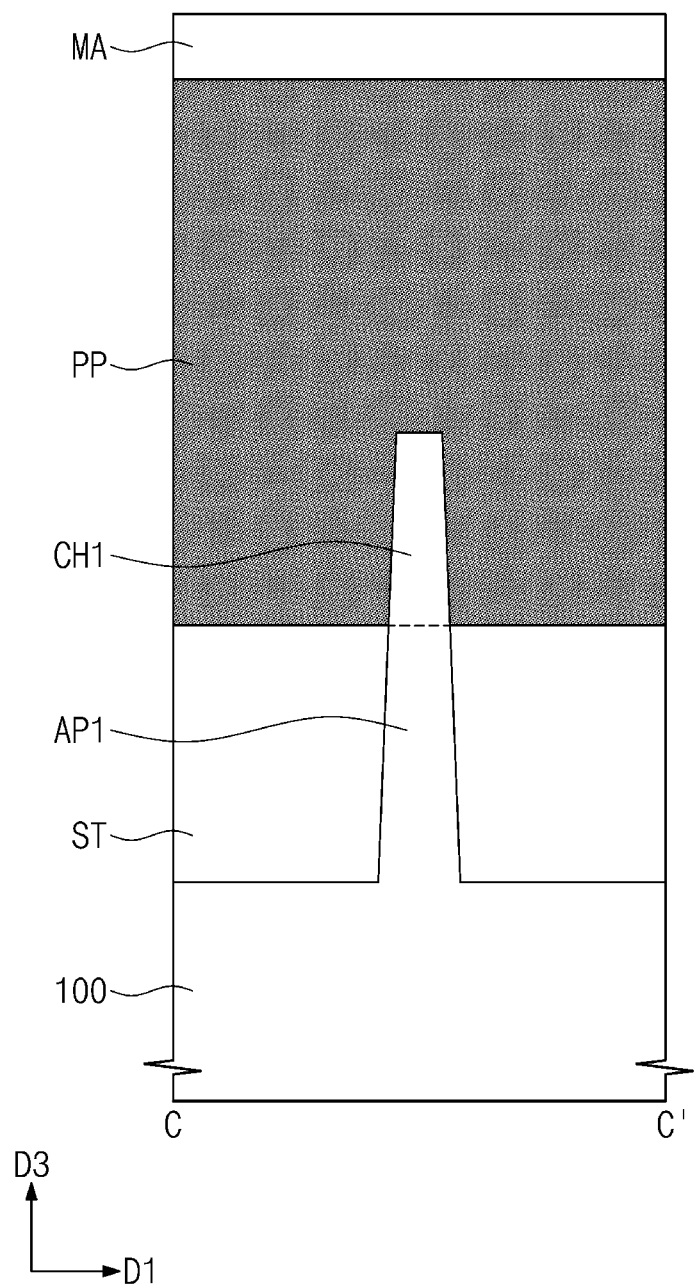
Figure 11:
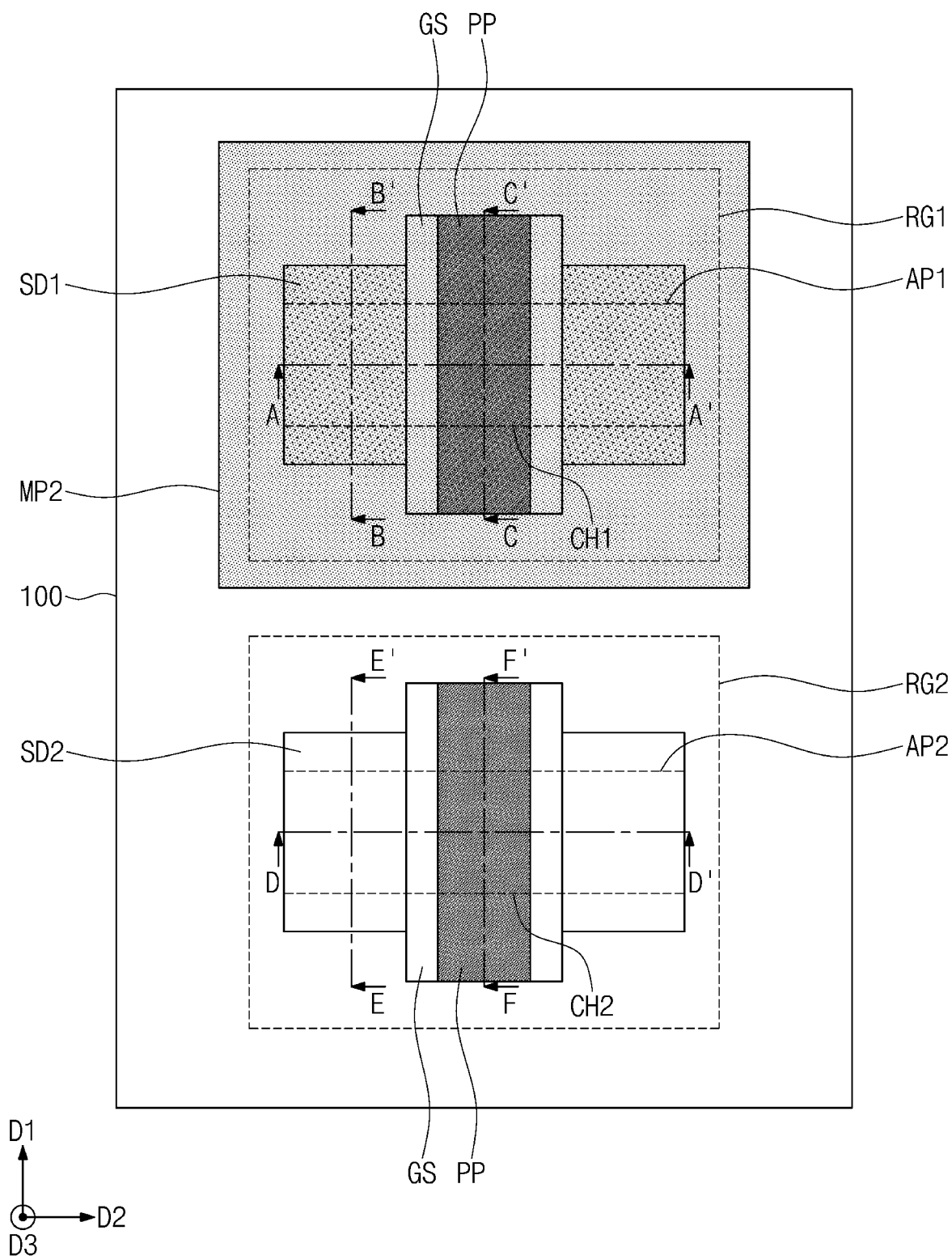
Figure 12A:
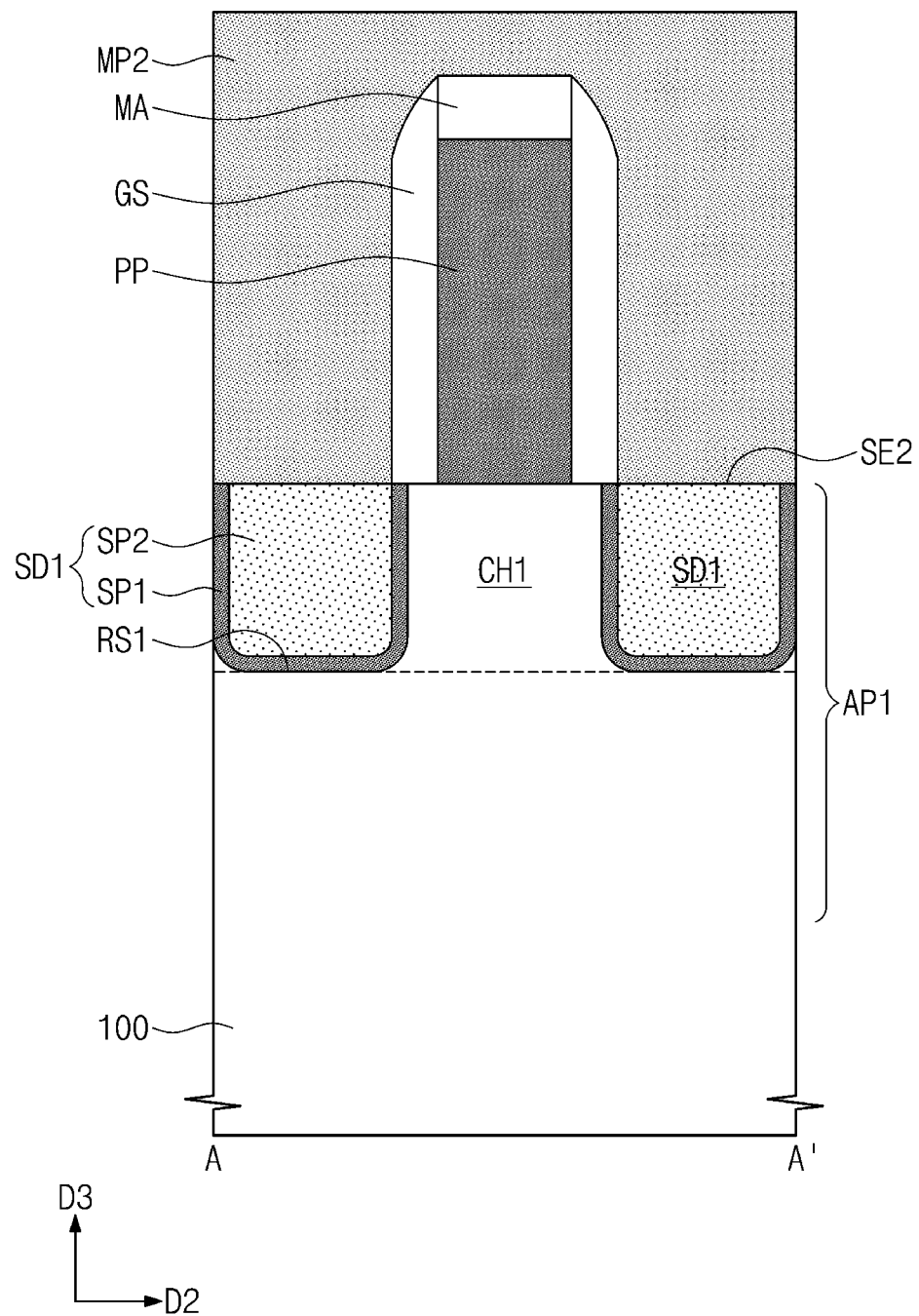
Figure 12B:
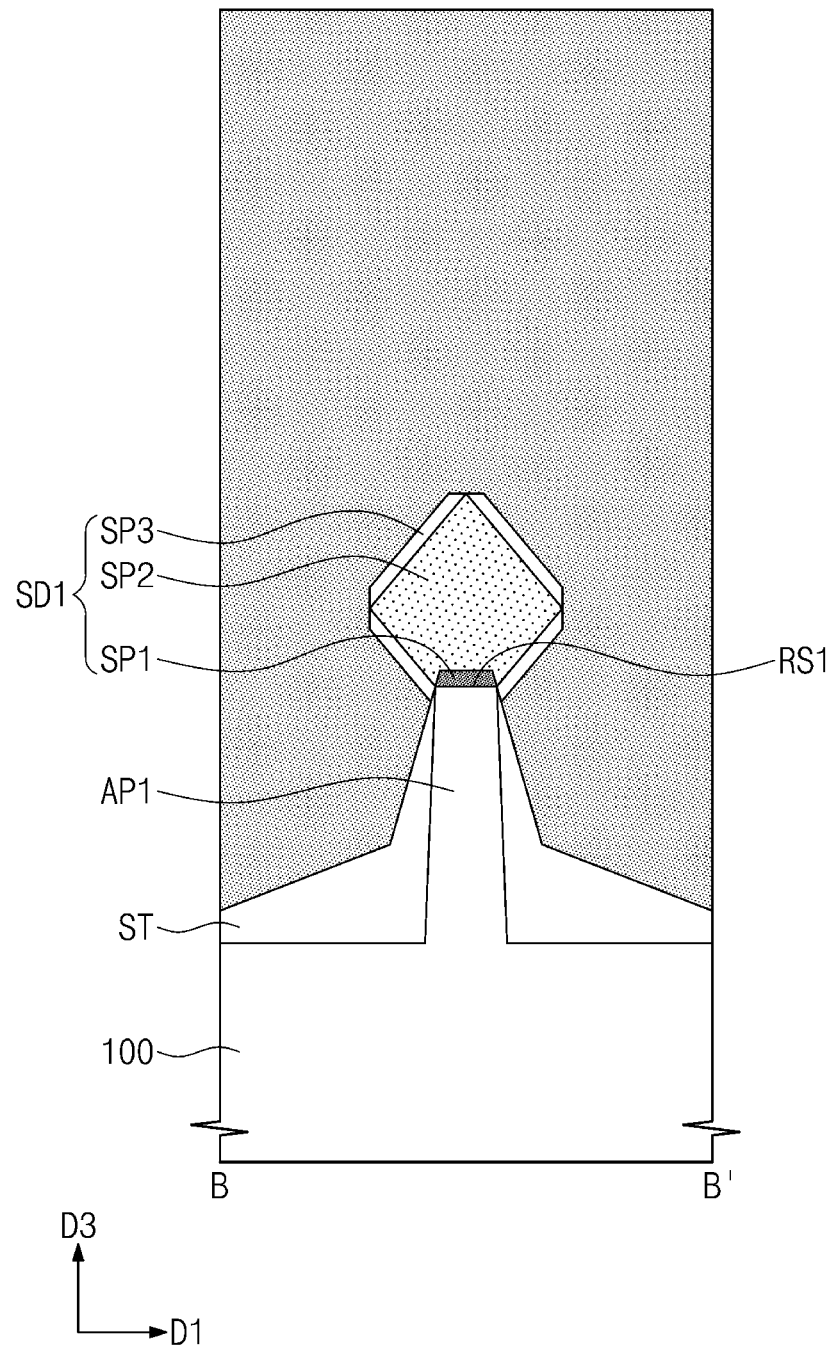
Figure 12C:
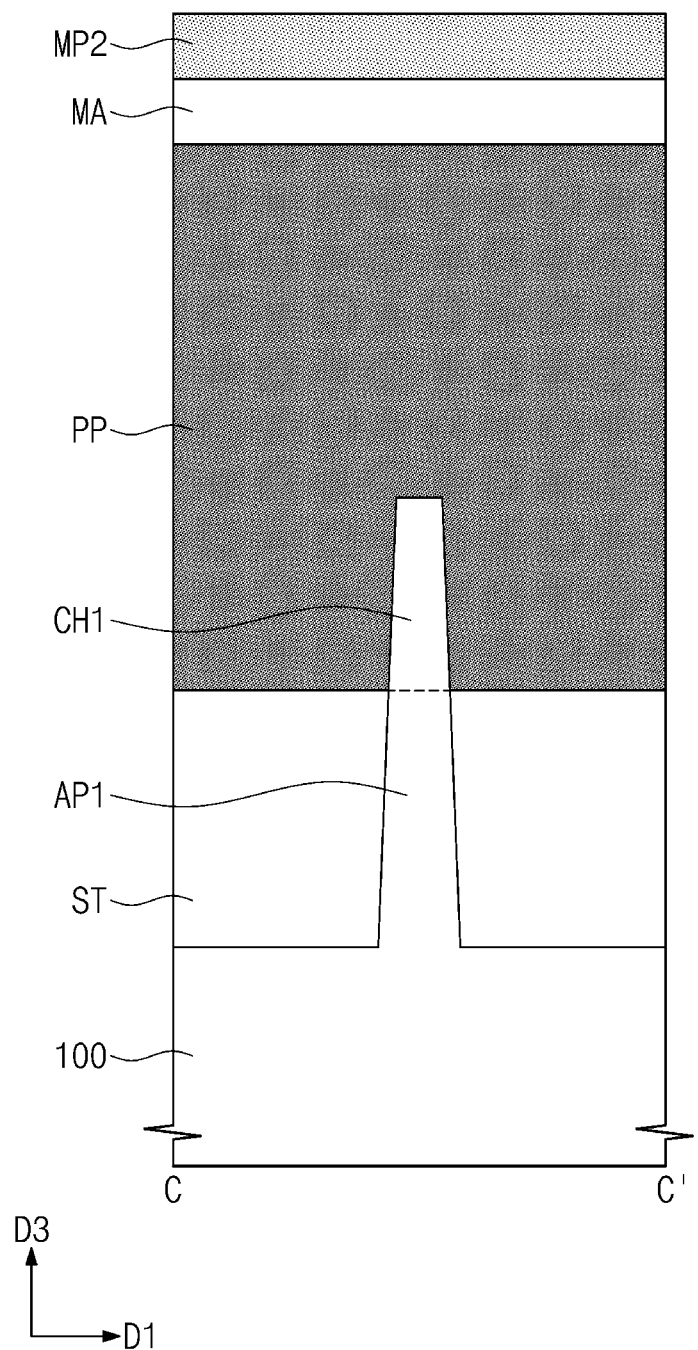
Figure 12D:
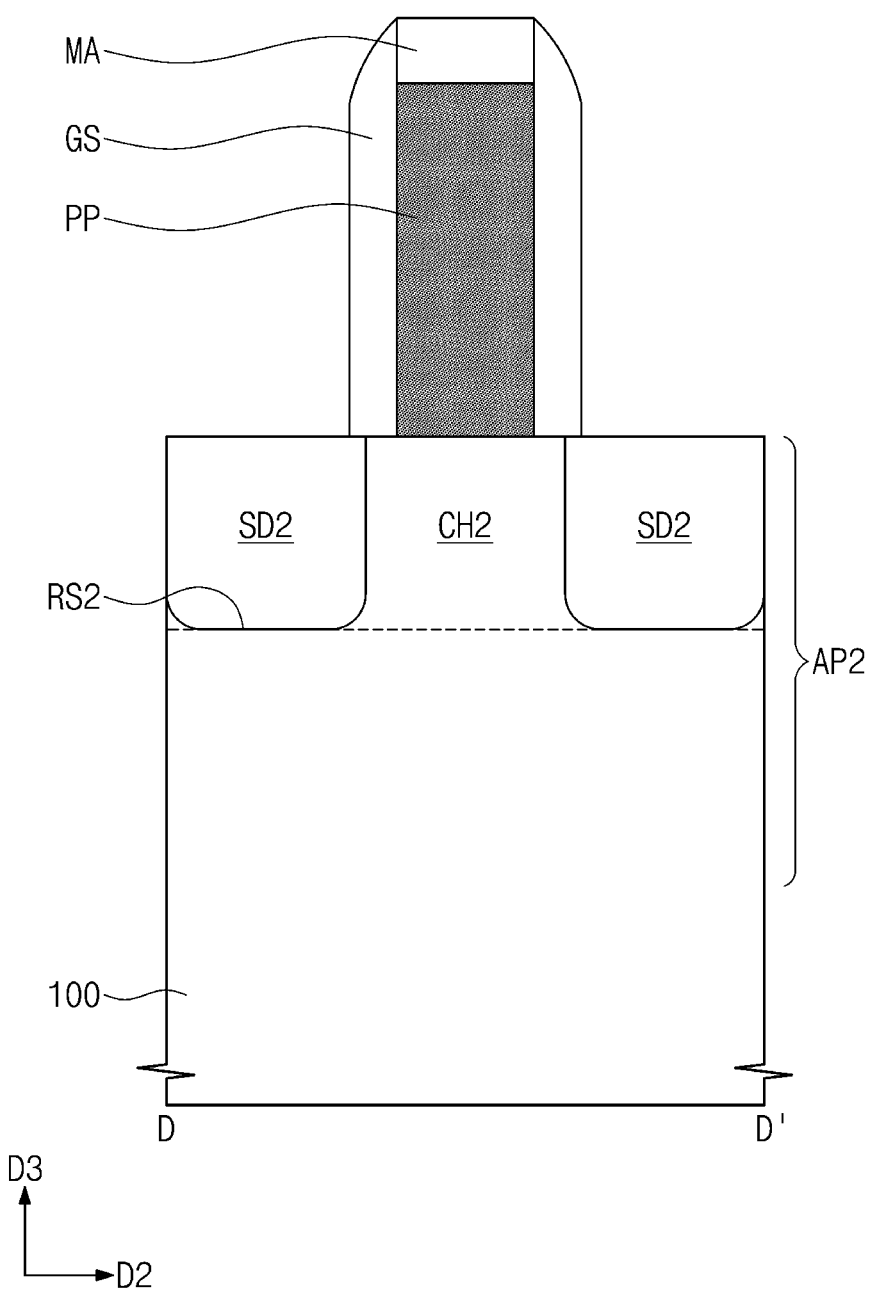
FIGS. 12D, 12E, and 12F illustrate cross-sectional views respectively taken along lines D-D', E-E', and F-F' of FIG. 11.
Figure 12E:
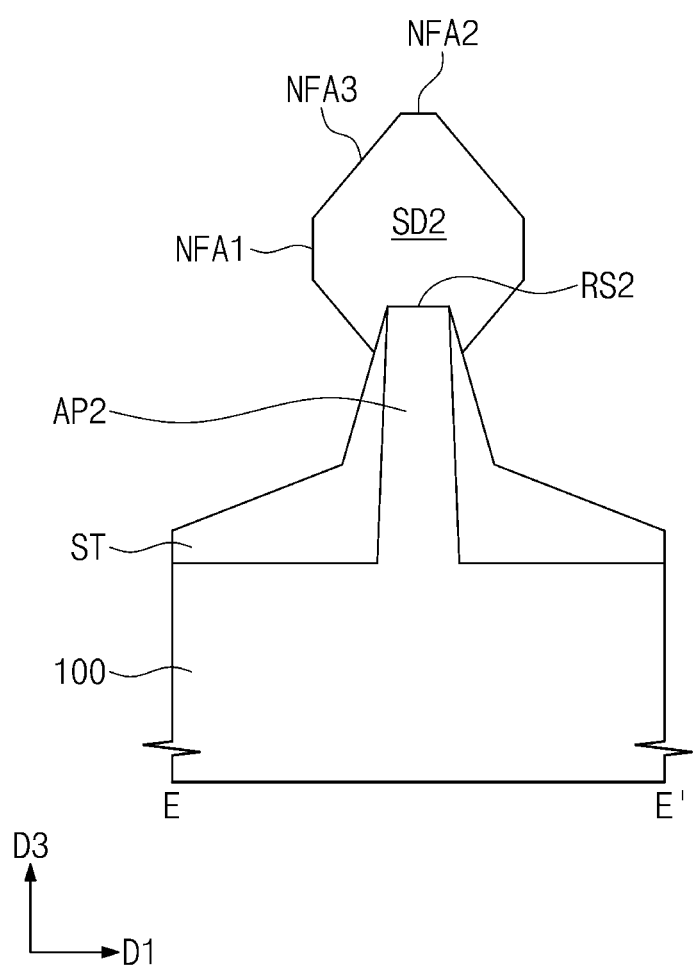
Figure 12F:
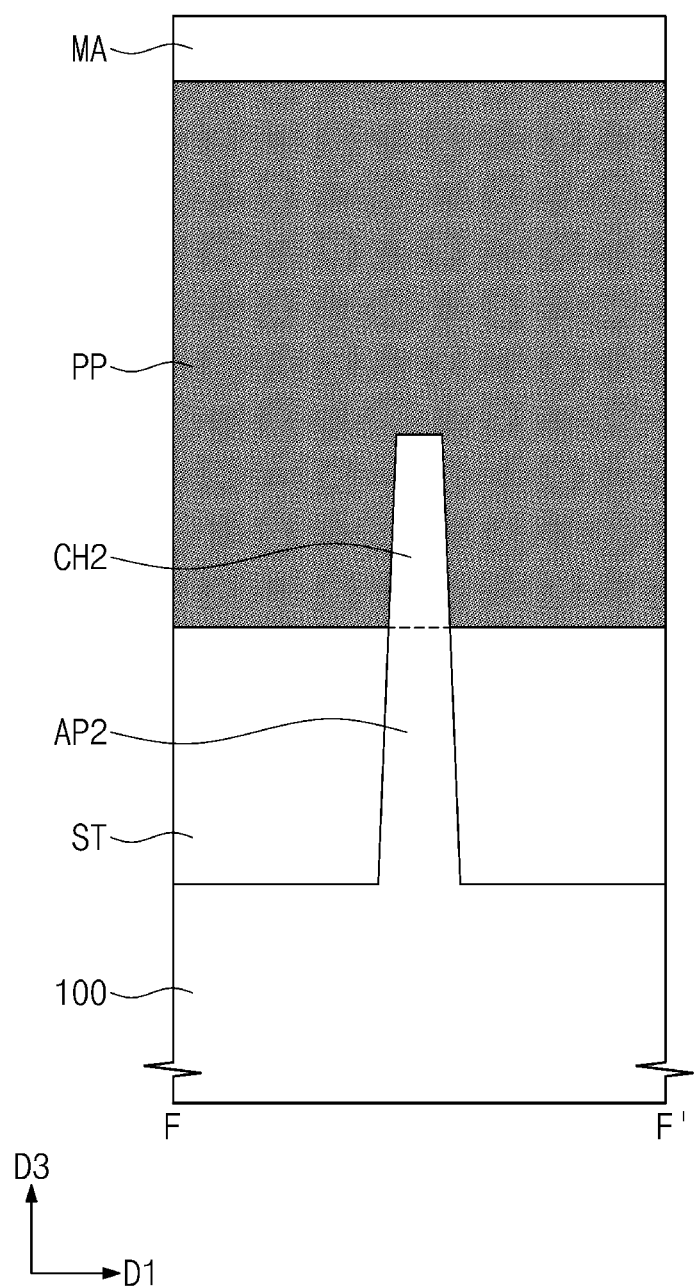
Figure 13:
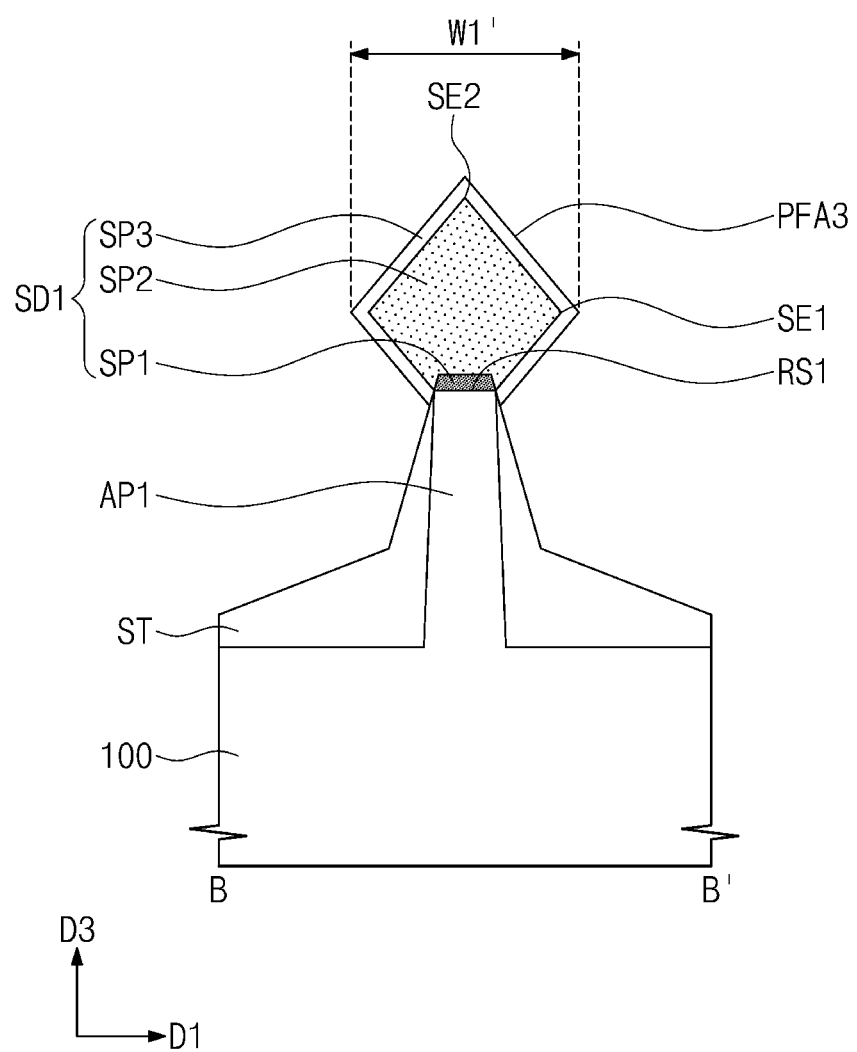
FIG. 13 illustrates a cross-sectional view taken along line B-B' of FIG. 9, showing a method of forming a first source/drain pattern according to exemplary embodiments.

FIGS. 3, 5, 7, 9, and 11 illustrate plan views showing a method of manufacturing a semiconductor device according to exemplary embodiments. FIGS. 4A, 6A, 8A, 10A, and 12A illustrate cross-sectional views taken along line A-A' of FIGS. 3, 5, 7, 9, and 11, respectively. FIGS. 4B, 6B, 8B, 10B, and 12B illustrate cross-sectional views taken along line B-B' of FIGS. 3, 5, 7, 9, and 11, respectively. FIGS. 6C, 8C, 10C, and 12C illustrate cross-sectional views taken along line C-C' of FIGS. 5, 7, 9, and 11, respectively. FIGS. 12D, 12E, and 12F illustrate cross-sectional views respectively taken along lines D-D', E-E', and F-F' of FIG. 11. FIG. 13 illustrates a cross-sectional view taken along line B-B' of FIG. 9, showing a method of forming a first source/drain pattern according to exemplary embodiments.

Figure 3:
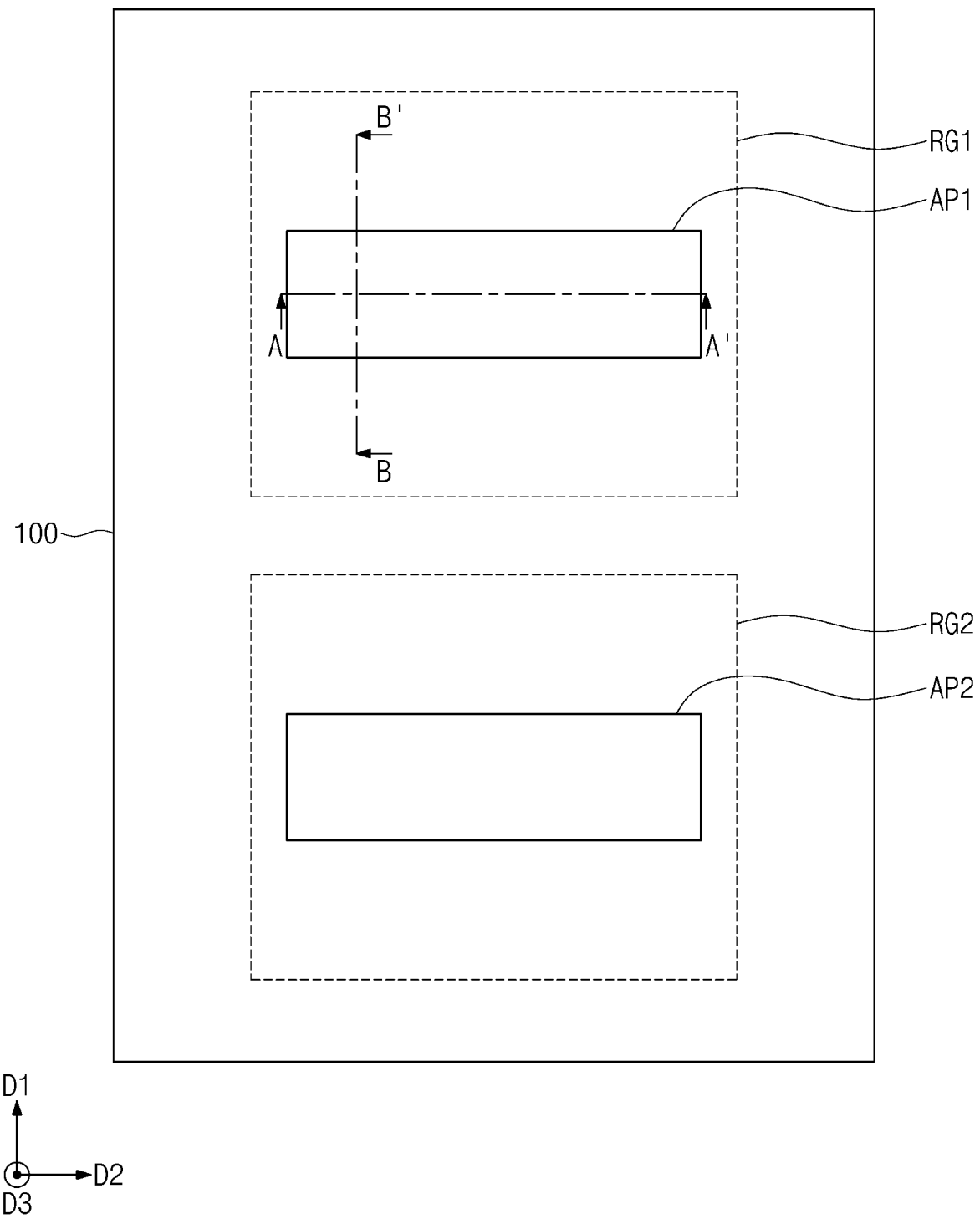
FIGS. 3, 5, 7, 9, and 11 illustrate plan views showing a method of manufacturing a semiconductor device according to exemplary embodiments.
Figure 4A:
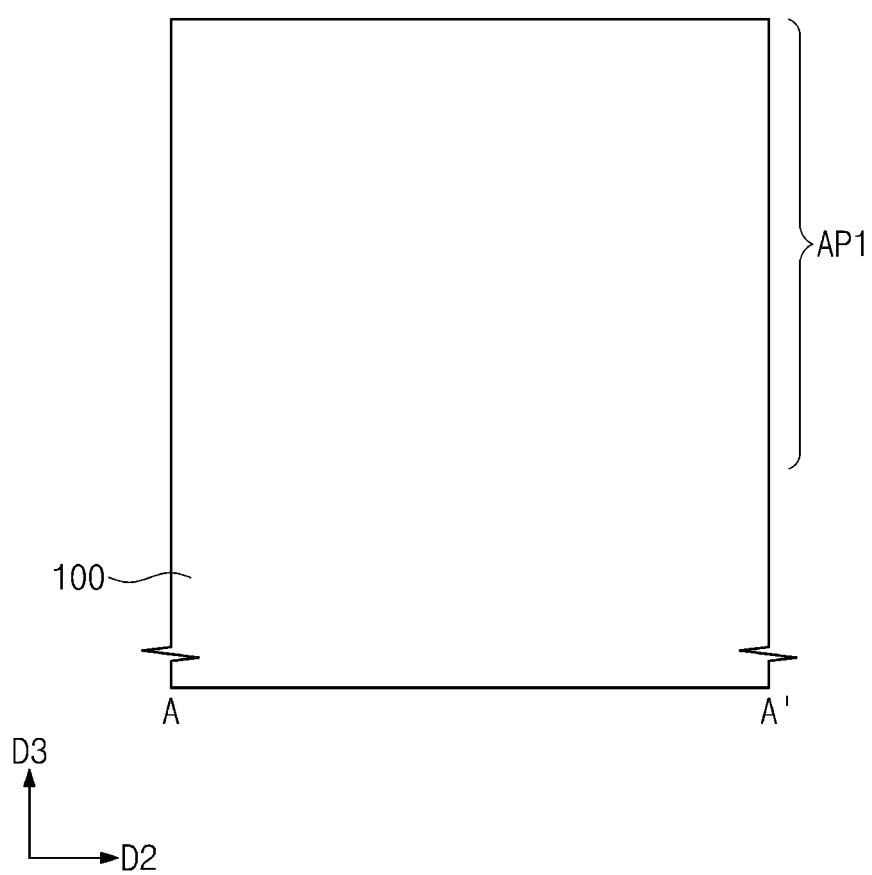
FIGS. 4A, 6A, 8A, 10A, and 12A illustrate cross-sectional views taken along line A-A' of FIGS. 3, 5, 7, 9, and 11, respectively.
Figure 4B:
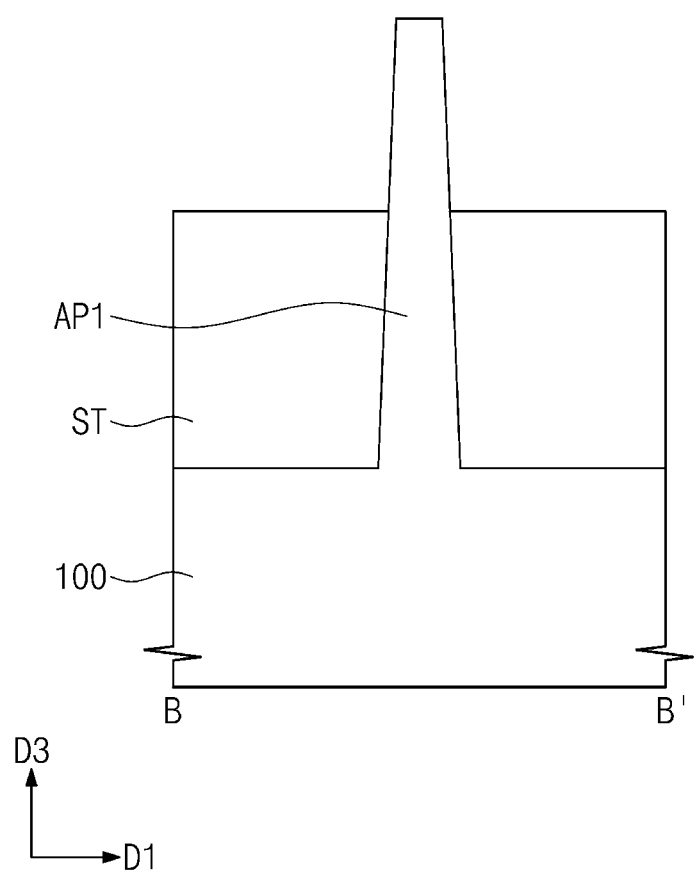
FIGS. 4B, 6B, 8B, 10B, and 12B illustrate cross-sectional views taken along line B-B' of FIGS. 3, 5, 7, 9, and 11, respectively.
Figure 5:
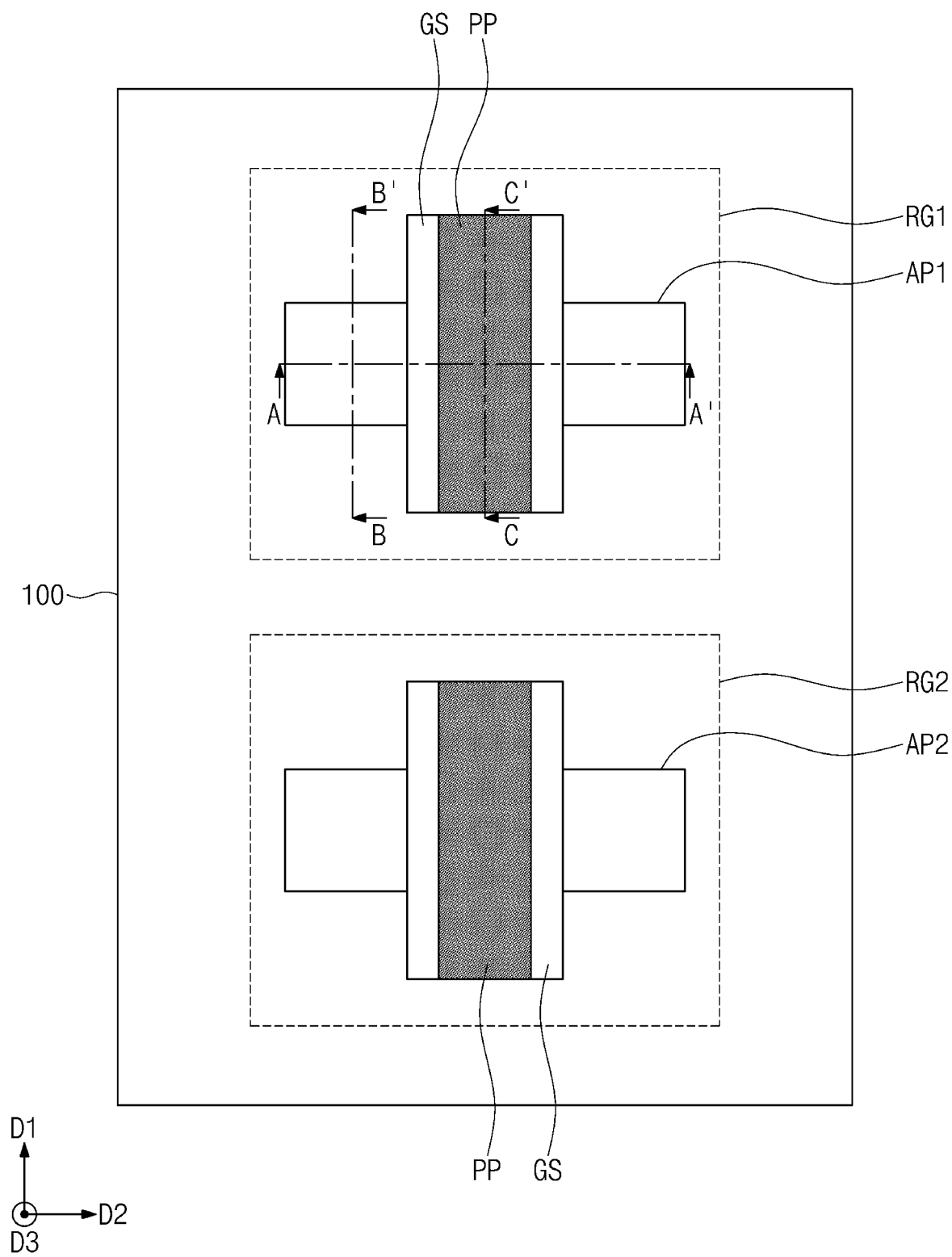
Figure 6A:
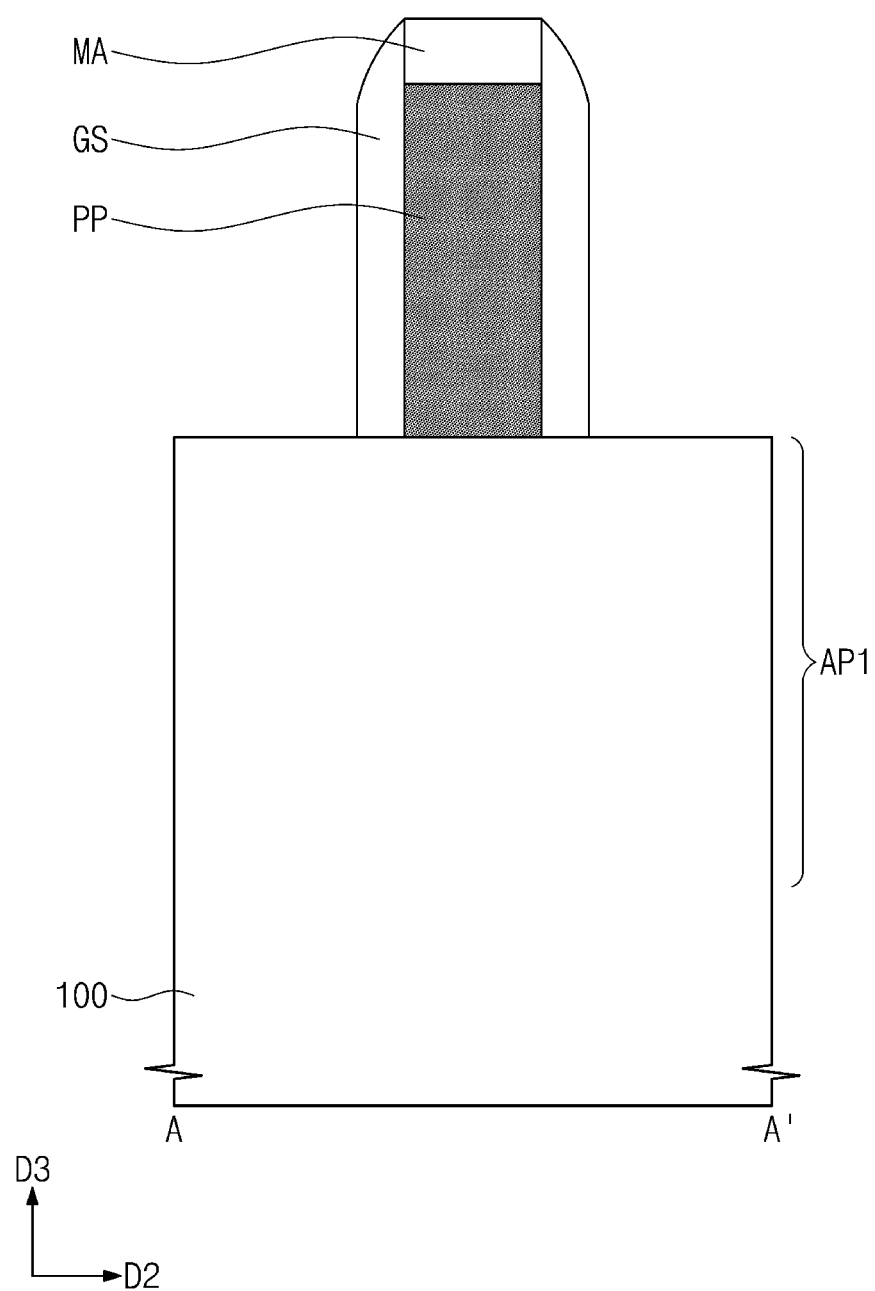
Figure 6B:
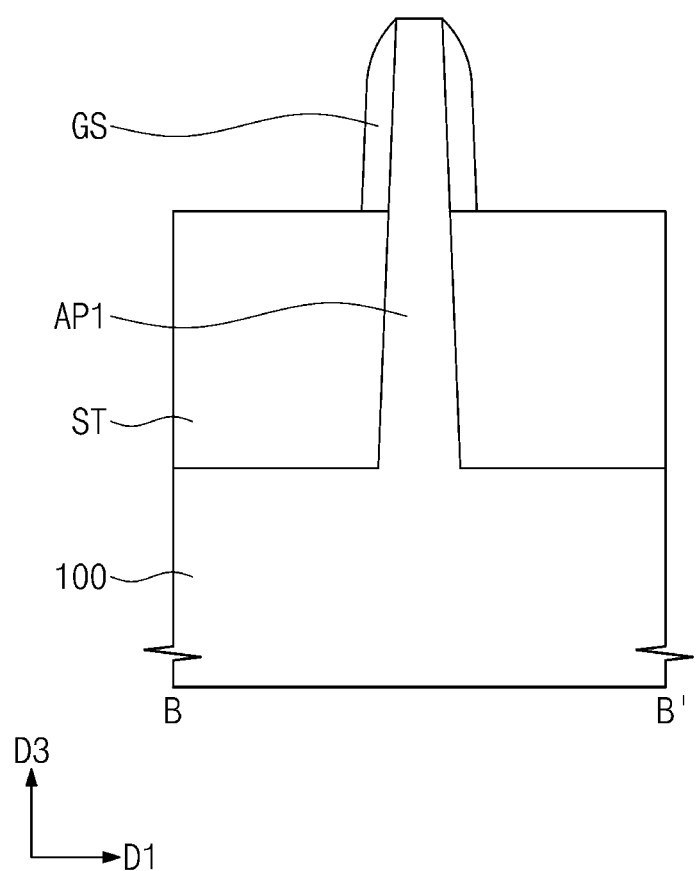
Figure 6C:
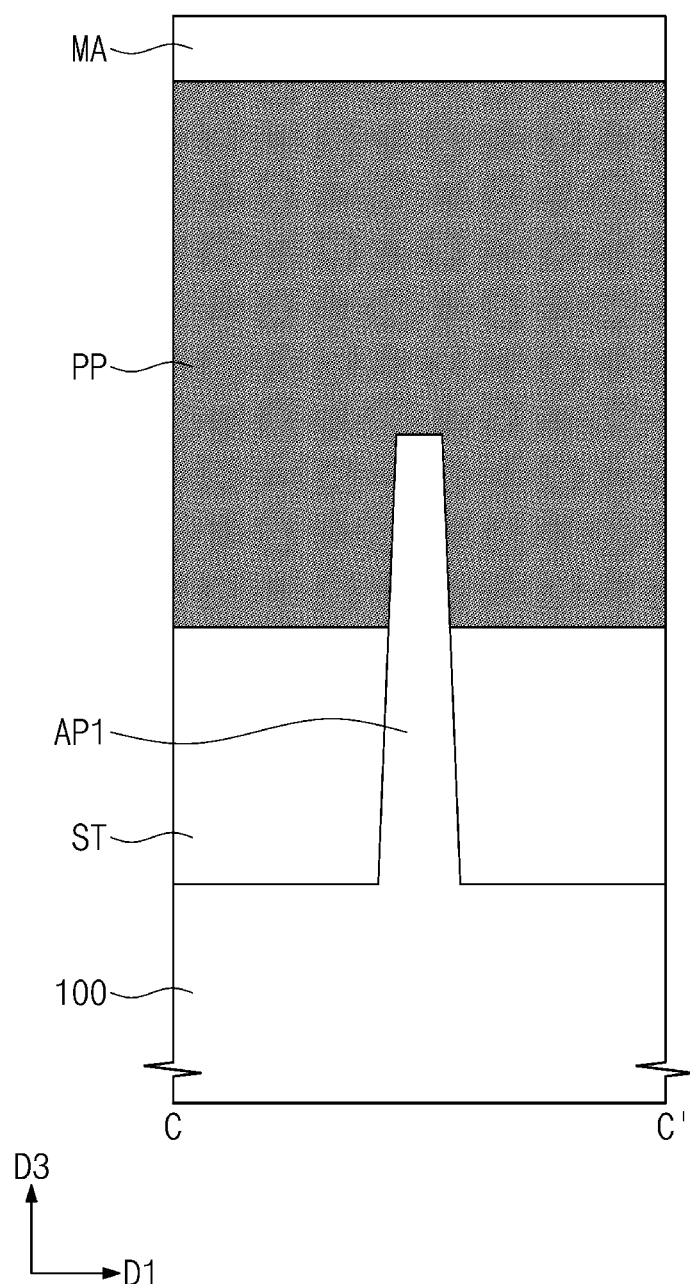
FIGS. 6C, 8C, 10C, and 12C illustrate cross-sectional views taken along line C-C' of FIGS. 5, 7, 9, and 11, respectively.
Figure 7:
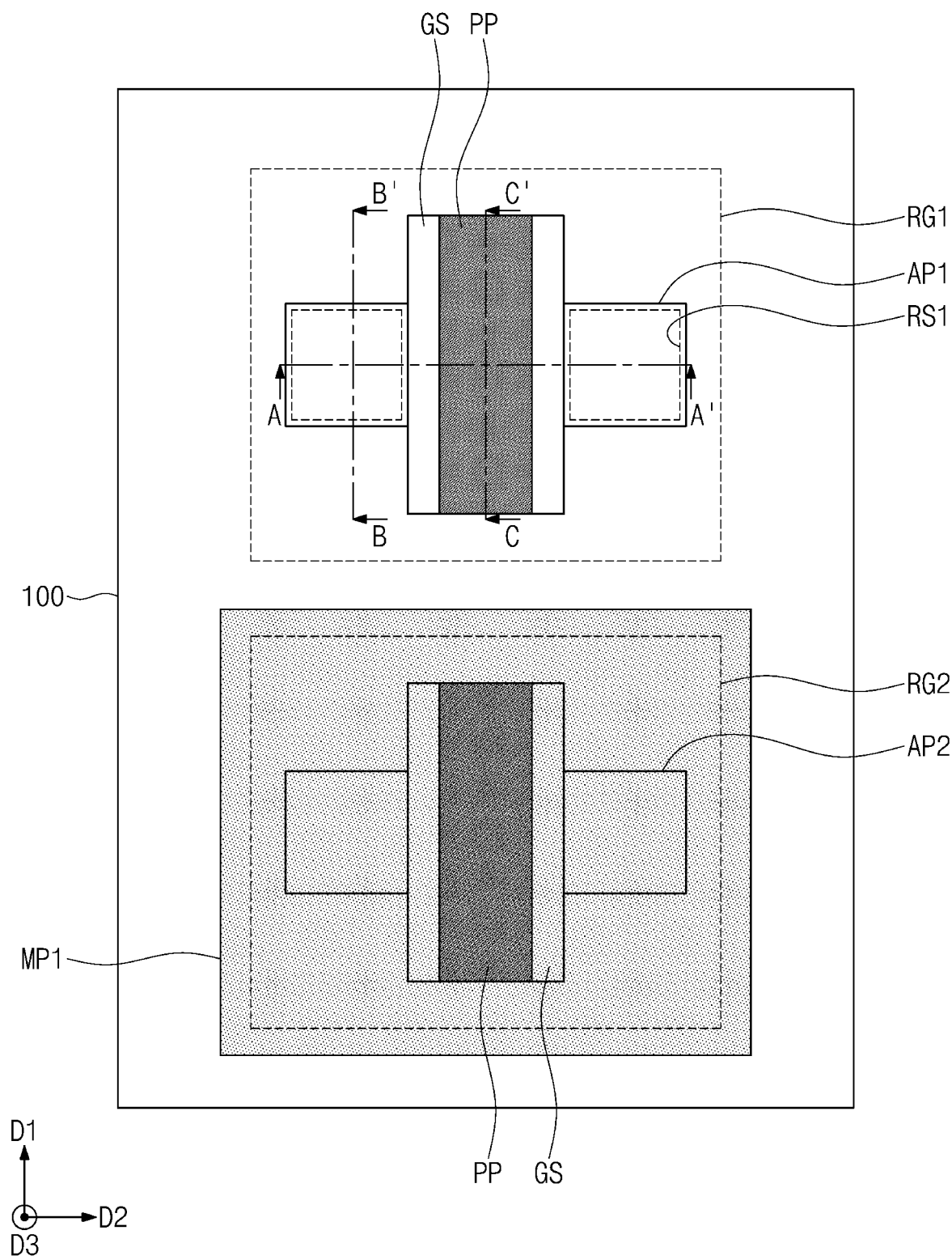
Figure 8A:
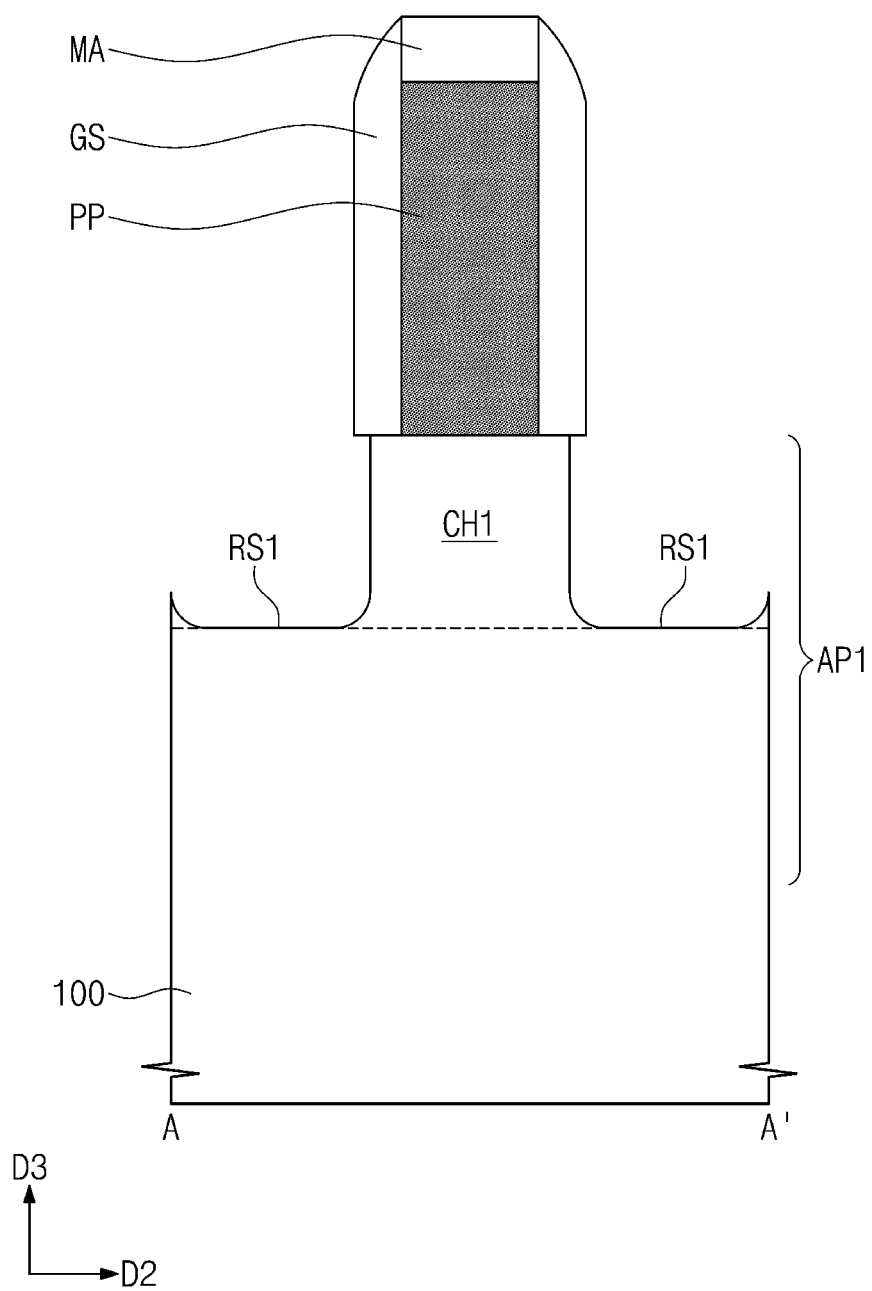
Figure 8B:
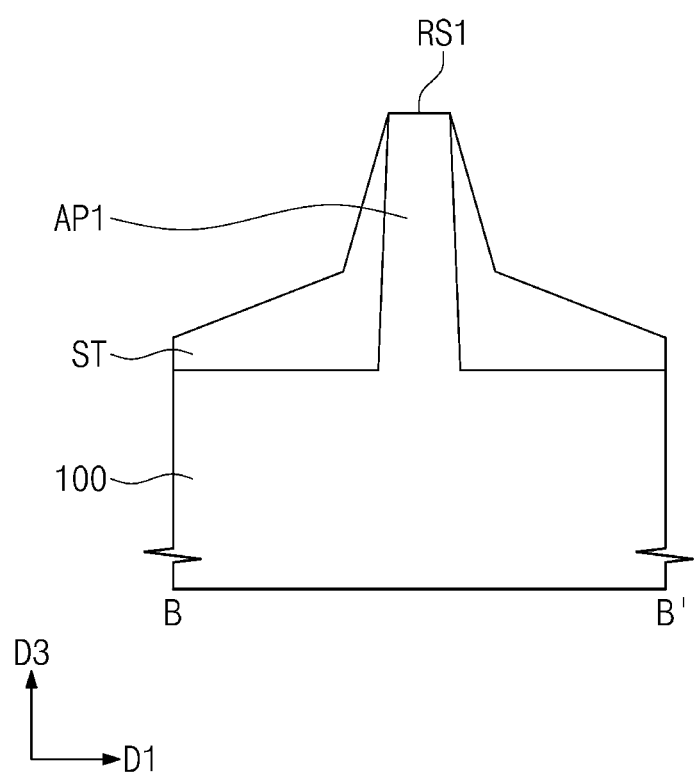
Figure 8C:
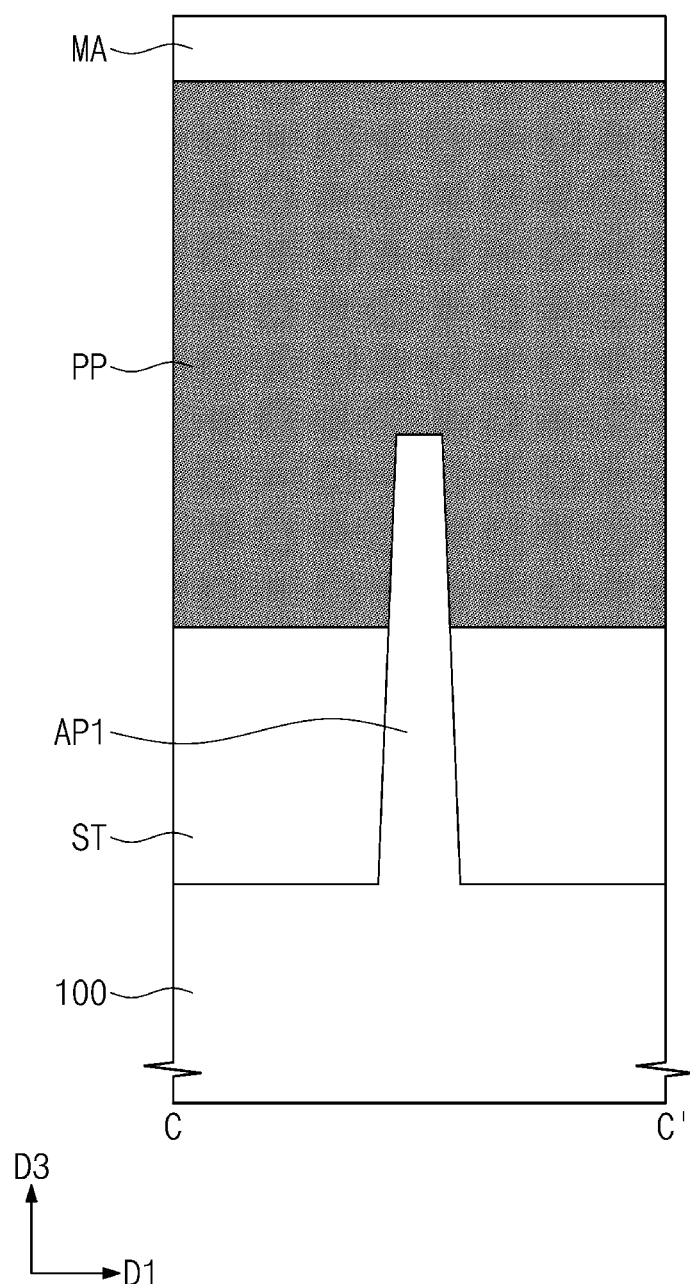

Referring to FIGS. 3, 4A, and 4B, a substrate 100 may be provided to include a first region RG1 and a second region RG2. An upper portion of the substrate 100 may be patterned to form a first active pattern AP1 and a second active pattern AP2 respectively on the first region RG1 and the second region RG2. For example, the formation of the first and second active patterns AP1 and AP2 may include forming mask patterns on the substrate 100, anisotropically etching the substrate 100 using the mask patterns as an etching mask, and removing the mask patterns. The substrate 100 may be a compound semiconductor substrate or a semiconductor substrate including silicon, germanium, silicon-germanium, or the like. For example, the substrate 100 may be a silicon substrate.

A device isolation layer ST may be provided on the upper portion of the substrate 100. For example, an insulation layer (e.g., a silicon oxide layer) may be formed on the substrate 100, thereby covering the first and second active patterns AP1 and AP2. The insulation layer may then be recessed until upper portions of the first and second active patterns AP1 and AP2 are exposed.

Referring to FIGS. 5 and 6A to 6C, sacrificial patterns PP may be formed to run across the first and second active patterns AP1 and AP2. Each of the sacrificial patterns PP may be formed to have a linear or bar shape extending in a first direction D1. For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include a polysilicon layer.

A pair of gate spacers GS may be formed on opposite sidewalls of each of the sacrificial patterns PP. The formation of the gate spacers GS may include conformally forming a spacer layer on the entire surface of the substrate 100 and anisotropically etching the spacer layer.

The gate spacers GS may also be formed on opposite sidewalls of each of the first and second active patterns AP1 and AP2. For example, the spacer layer may also be formed on the opposite sidewalls of each of the first and second active patterns AP1 and AP2, and may remain even after the anisotropic etching process.

The spacer layer may include one or more of SiCN, SiCON, and SiN. Alternatively, the spacer layer may be a multiple layer including two or more of SiCN, SiCON, and SiN.

Referring to FIGS. 7 and 8A to 8C, a first mask layer MP1 may be formed to cover the second region RG2. The first mask layer MP1 may expose the first region RG1.

The first active pattern AP1 on the first region RG1 may be partially etched on its upper portion to form first recesses RS1. The formation of the first recesses RS1 may include performing an etching process in which the hardmask patterns MA and the gate spacers GS are used as an etching mask to etch the upper portion of the first active pattern AP1. When the etching process is performed, the gate spacers GS may be removed from the opposite sidewalls of the first active pattern AP1. When the etching process is performed, an exposed device isolation layer ST may be recessed. When the etching process is performed, the first mask layer MP1 may protect the second region RG2 from being etched.

Referring to FIGS. 9 and 10A to 10C, first source/drain patterns SD1 may be formed to fill the first recesses RS1. For example, the formation of the first source/drain patterns SD1 may include performing a selective epitaxial growth process in which inner sidewalls of the first recesses RS1 are used as seed layers. As the first source/drain patterns SD1 are formed, a first channel region CH1 may be defined between a pair of the first source/drain patterns SD1. For example, the selective epitaxial growth process may include chemical vapor deposition (CVD) or molecular beam epitaxy (MBE).

Each of the first source/drain patterns SD1 may include a second semiconductor element whose lattice constant is greater than that of a first semiconductor element of the substrate 100. For example, the first semiconductor element may be silicon, and the second semiconductor element may be germanium. Each of the first source/drain patterns SD1 may be formed to have a plurality of semiconductor layers. Each of the first source/drain patterns SD1 may include first, second, and third semiconductor patterns SP1, SP2, and SP3 that are sequentially formed.

The first semiconductor pattern SP1 may be formed by a first selective epitaxial growth process in which the inner sidewall of the recess RS1 is used as a seed layer. The first semiconductor pattern SP1 may contain the second semiconductor element whose concentration is low. The first semiconductor pattern SP1 may be in-situ doped with a low concentration impurity. Alternatively, after the first semiconductor pattern SP1 is formed, a low concentration impurity may be doped into the first semiconductor pattern SP1. For example, the first semiconductor pattern SP1 may include silicon-germanium (SiGe) into which boron is doped. The first semiconductor pattern SP1 may contain a germanium (Ge) content of about 15 at % to about 25 at %.

The first selective epitaxial growth process may be performed under a pressure condition greater than that under which a subsequent second selective epitaxial growth process is performed. For example, the first selective epitaxial growth process may be performed under a pressure of about 50 Torr to about 250 Torr. The first semiconductor pattern SP1 may thus be conformally formed on the inner sidewall of the first recess RS1.

The second semiconductor pattern SP2 may be formed by a second selective epitaxial growth process in which the first semiconductor pattern SP1 is used as a seed layer. The second semiconductor pattern SP2 may contain the second semiconductor element whose concentration is greater than that of the second semiconductor element contained in the first semiconductor pattern SP1. The second semiconductor pattern SP2 may be in-situ doped with a high concentration impurity. Alternatively, after the second semiconductor pattern SP2 is formed, a high concentration impurity may be doped into the second semiconductor pattern SP2. For example, the second semiconductor pattern SP2 may include silicon-germanium (SiGe) into which boron is doped. The second semiconductor pattern SP2 may contain a germanium (Ge) content of about 25 at % to about 75 at %.

The second selective epitaxial growth process may be performed under a pressure condition less than that under which the first selective epitaxial growth process is performed. For example, the second selective epitaxial growth process may be performed under a pressure of about 10 Torr to about 50 Torr.

The third semiconductor pattern SP3 may be formed by a third selective epitaxial growth process in which the second semiconductor pattern SP2 is used as a seed layer. The third semiconductor pattern SP3 may include the first semiconductor element the same as that of the substrate 100. For example, the third semiconductor pattern SP3 may include single crystalline silicon (Si). The aforementioned first to third selective epitaxial growth processes may be sequentially performed in the same chamber.

Referring to FIG. 13, in one embodiment, the third semiconductor pattern SP3 may be initially formed to completely cover the second semiconductor pattern SP2. For example, the third semiconductor pattern SP3 may cover first and second corner edges SE1 and SE2 of the second semiconductor pattern SP2. The first source/drain pattern SD1 may include only a third face PFA3, a (111) plane. The first source/drain pattern SD1 may have a maximum width W1' in the first direction D1.

Referring back to FIG. 10B, the third semiconductor pattern SP3 may be partially etched to cause the first source/drain pattern SD1 to additionally have a first face PFA1 and a second face PFA2. The first face PFA1 may be a (110) plane, and the second face PFA2 may be a (100) plane.

For example, the partial etching of the third semiconductor pattern SP3 may be achieved by an etching process in which the first face PFA1 or (110) plane is etched faster than the third face PFA3 or (111) plane. For example, the partial etching of the third semiconductor pattern SP3 may be achieved by an etching process in which the second face PFA2 or (100) plane is etched faster than the third face PFA3 or (111) plane. In one embodiment, when the etching process is performed, the etch rate of the first face PFA1 may be equal to or greater than 10 times the etch rate of the third face PFA3. Also, when the etching process is performed, the etch rate of the second face PFA2 may be equal to or greater than 10 times the etch rate of the third face PFA3.

The partial etching of the third semiconductor pattern SP3 may continue until the first and second corner edges SE1 and SE2 of the second semiconductor pattern SP2 are exposed. The first and second semiconductor patterns SP1 and SP2 may not be substantially etched during the etching process. A maximum width W1 of the first source/drain pattern SD1 after the etching process may be less than the maximum width Wr of the first source/drain pattern SD1 before the etching process.

The etching process may be a dry etching process or a wet etching process. When a dry etching process is chosen, the dry etching process may use an etching gas including HCl, $Cl_2$, or a combination thereof. The etching gas may additionally include germane, GeH4. When a wet etching process is chosen, the wet etching process may use an etchant whose etch rate of silicon is equal to or greater than 10 time the etch rate of silicon oxide.

The etching process may be performed in the same chamber in which the first to third selective epitaxial growth processes are sequentially performed. Alternatively, the etching process may be performed in a different chamber from that in which the first to third selective epitaxial growth processes are sequentially performed.

Referring to FIGS. 11 and 12A to 12F, the first mask layer MP1 may be removed from the second region RG2. A second mask layer MP2 may be formed to cover the first region RG1. The second mask layer MP2 may expose the second region RG2.

The second active pattern AP2 on the second region RG2 may be partially etched on its upper portion to form second recesses RS2. When the etching process is performed, the second mask layer MP2 may protect the first region RG1 from being etched.

Second source/drain patterns SD2 may be formed to fill the second recesses RS2. For example, the formation of the second source/drain patterns SD2 may include performing a selective epitaxial growth process in which inner sidewalls of the second recesses RS2 are used as seed layers. As the second source/drain patterns SD2 are formed, a second channel region CH2 may be defined between a pair of the second source/drain patterns SD2. Each of the second source/drain patterns SD2 may be formed to have a single semiconductor layer. For example, the second source/drain patterns SD2 may include silicon, the same semiconductor element as that of the substrate 100.

The second source/drain patterns SD2 may be partially etched to additionally have a first face NFA1 and a second face NFA2. Each of the second source/drain patterns SD2 may therefore include first, second, and third faces NFA1, NFA2, and NFA3.

For example, the partial etching of the second source/drain patterns SD2 may be achieved by an etching process in which the first face NFA1 or (110) plane is etched faster than the third face NFA3 or (111) plane. The partial etching of the second source/drain patterns SD2 may be achieved by an etching process in which the second face NFA2 or (100) plane is etched faster than the third face NFA3 or (111) plane. The partial etching of the second source/drain patterns SD2 may use substantially the same etching process as that for the partial etching of the third semiconductor pattern SP3 discussed above.

Referring back to FIGS. 1 and 2A to 2F, the second mask layer MP2 may be removed from first region RG1. A first interlayer dielectric layer 110 may be formed to cover the first and second source/drain patterns SD1 and SD2, the hardmask patterns MA, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be performed to planarize the first interlayer dielectric layer 110. The hardmask patterns MA may all be removed during the planarization process. Upper portions of the gate spacers GS may be removed during the planarization process. As a result, the first interlayer dielectric layer 110 may have a top surface substantially coplanar with the top surfaces of the sacrificial patterns SP and top surfaces of the gate spacers GS.

The sacrificial patterns PP may be replaced with gate electrodes GE. The formation of the gate electrodes GE may include selectively removing the sacrificial patterns PP, and a gate dielectric pattern GI and the gate electrode may be formed in an empty space where each of the sacrificial patterns PP is removed.

The gate dielectric pattern GI may be conformally formed by an atomic layer deposition (ALD) process or a chemical oxidation process. For example, the gate dielectric pattern GI may include a high-k dielectric material. The high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include using one or more of conductive metal nitride (e.g., titanium nitride or tantalum nitride) and metal (e.g., titanium, tantalum, tungsten, copper, or aluminum).

The gate electrodes GE may be recessed on their upper portions. Gate capping patterns GP may be formed on the gate electrodes GE. The gate capping patterns GP may be formed to completely fill recessed regions of the gate electrodes GE. The gate capping patterns GP may include using one or more of SiON, SiCN, SiCON, and SiN.

Figure 14A:
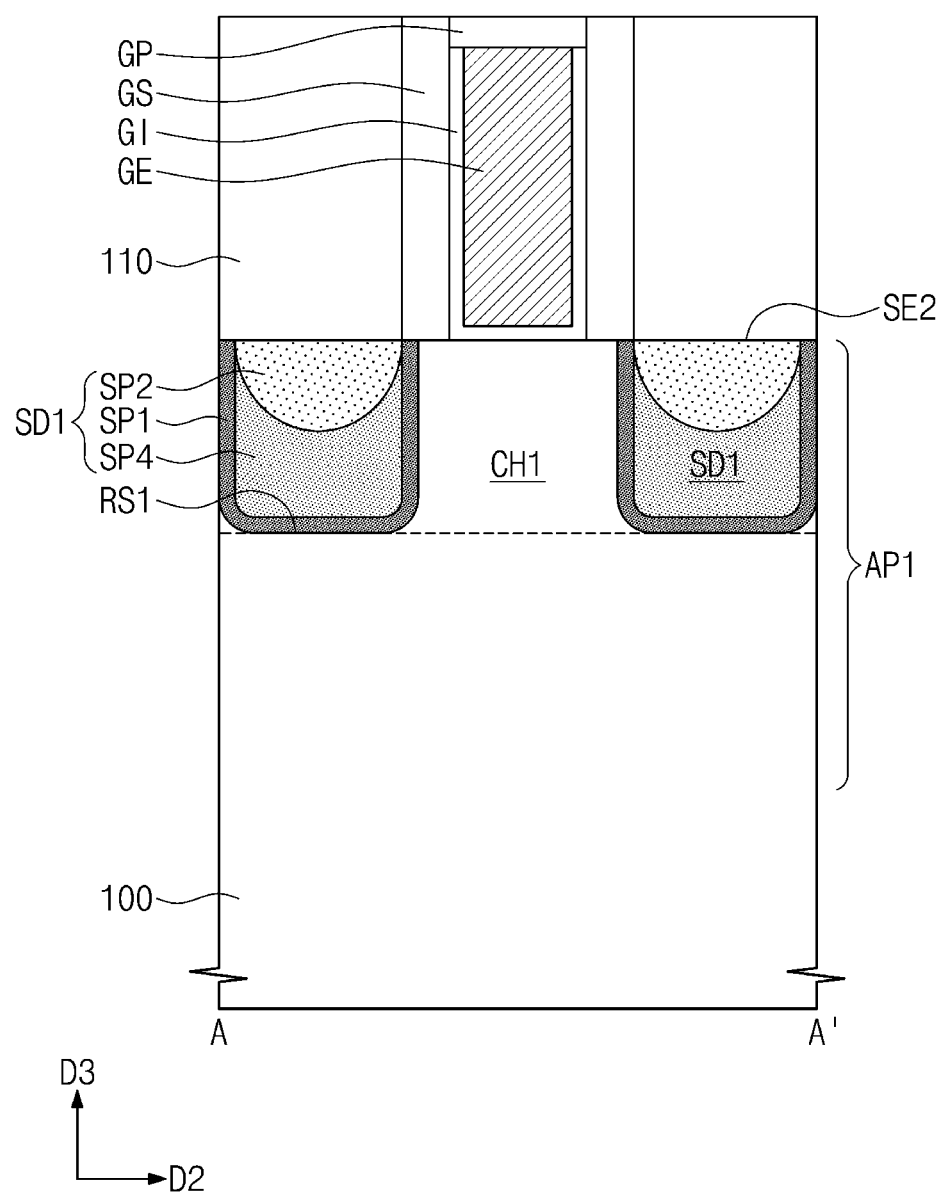
FIGS. 14A and 14B illustrate cross-sectional views respectively taken along lines A-A' and B-B' of FIG. 1, showing a method of manufacturing a semiconductor device according to exemplary embodiments.
Figure 14B:
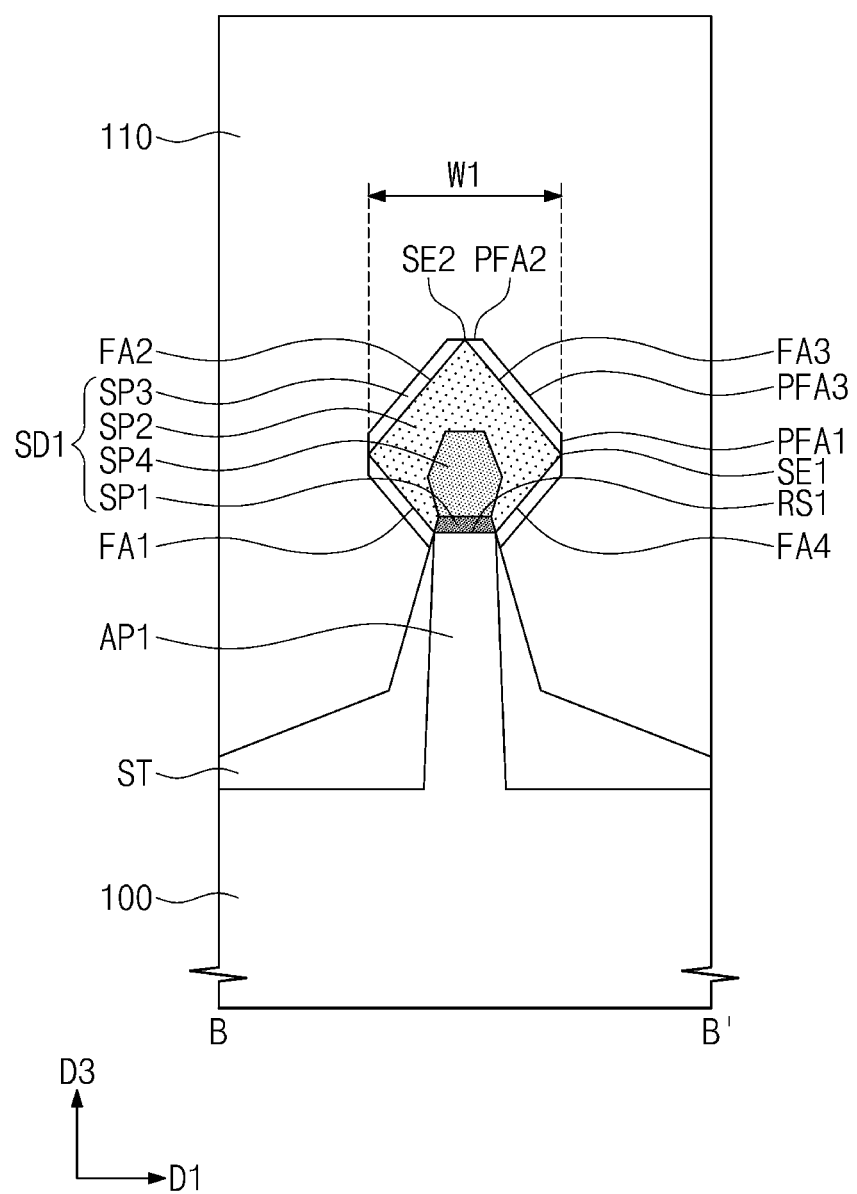

FIGS. 14A and 14B illustrate cross-sectional views respectively taken along lines A-A' and B-B' of FIG. 1, showing a method of manufacturing a semiconductor device according to exemplary embodiments. In the embodiment that follows, a detailed description of technical features repetitive to those discussed above with reference to FIGS. 1 and 2A to 2F will be omitted, and a difference thereof will be discussed in detail.

Referring to FIGS. 1, 14A, and 14B, the first source/drain pattern SD1 may further include a fourth semiconductor pattern SP4. The fourth semiconductor pattern SP4 may be interposed between the first and second semiconductor patterns SP1 and SP2. The fourth semiconductor pattern SP4 may cover an inner sidewall of the first semiconductor pattern SP1. When viewed in cross-section along the second direction D2, the fourth semiconductor pattern SP4 may have a U-shaped top surface. The second semiconductor pattern SP2 may have a volume greater than that of each of the first, third, and fourth semiconductor patterns SP1, SP3, and SP4.

The fourth semiconductor pattern SP4 may contain germanium (Ge) whose content is greater than that of germanium (Ge) contained in the first semiconductor pattern SP1. For example, the fourth semiconductor pattern SP4 may contain a germanium (Ge) content of 25 at % to about 50 at %. The second semiconductor pattern SP2 may contain germanium (Ge) whose content is greater than that of germanium (Ge) contained in the fourth semiconductor pattern SP4. For example, the second semiconductor pattern SP2 may contain a germanium (Ge) content of 51 at % to about 75 at %.

FIGS. 15A, 15B, 15C, and 15D illustrate cross-sectional views respectively taken along lines A-A', C-C', D-D', and F-F' of FIG. 1, showing a semiconductor device according to exemplary embodiments. In the embodiment that follows, a detailed description of technical features repetitive to those discussed above with reference to FIGS. 1 and 2A to 2F will be omitted, and a difference thereof will be discussed in detail.

Referring to FIGS. 1, 2B, 2E, and 15A to 15D, the first channel region CH1 of the first active pattern AP1 may include a plurality of first channel patterns CP1 that are vertically stacked. The second channel region CH2 of the second active pattern AP2 may include a plurality of second channel patterns CP2 that are vertically stacked.

The first channel patterns CP1 may be spaced apart from each other in a third direction D3 perpendicular to the top surface of the substrate 100. The first channel patterns CP1 may vertically overlap each other. The first source/drain patterns SD1 may contact sidewalls of the first channel patterns CP1. For example, the first channel patterns CP1 may connect a pair of neighboring first source/drain patterns SD1 to each other. Three first channel patterns CP1 are exemplarily illustrated, but the number of the first channel patterns CP1 is not particularly limited. The first channel patterns CP1 may have the same thickness as each other or different thicknesses from each other.

The first channel patterns CP1 may include substantially the same semiconductor material. For example, the first channel patterns CP1 may include one or more of silicon, germanium, and silicon-germanium. A detailed description of the second channel patterns CP2 may be substantially the same as or similar to that of the first channel patterns CP1.

The gate electrode GE on the first active pattern AP1 may surround each of the first channel patterns CP1 (see FIG.

15B). For example, the gate electrode GE on the first active pattern AP1 may surround top and bottom surfaces and opposite sidewalls of each of the first channel patterns CP1. A transistor according to some embodiments may be a gate-all-around type field effect transistor. The gate dielectric patterns GI may be interposed between the gate electrode GE and the first channel patterns CP1.

Figure 15A:
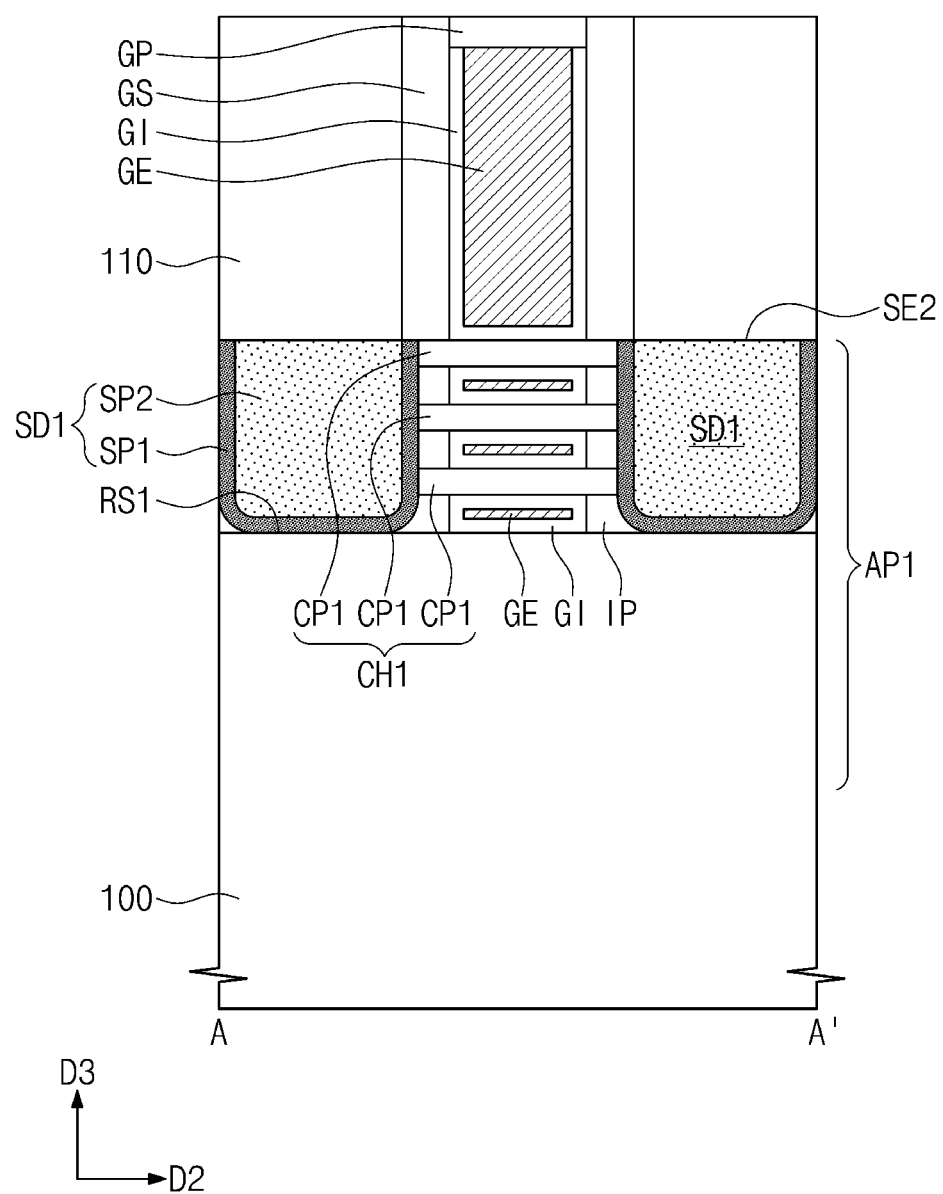
FIGS. 15A, 15B, 15C, and 15D illustrate cross-sectional views respectively taken along lines A-A', C-C', D-D', and F-F' of FIG. 1, showing a semiconductor device according to exemplary embodiments.
Figure 15B:
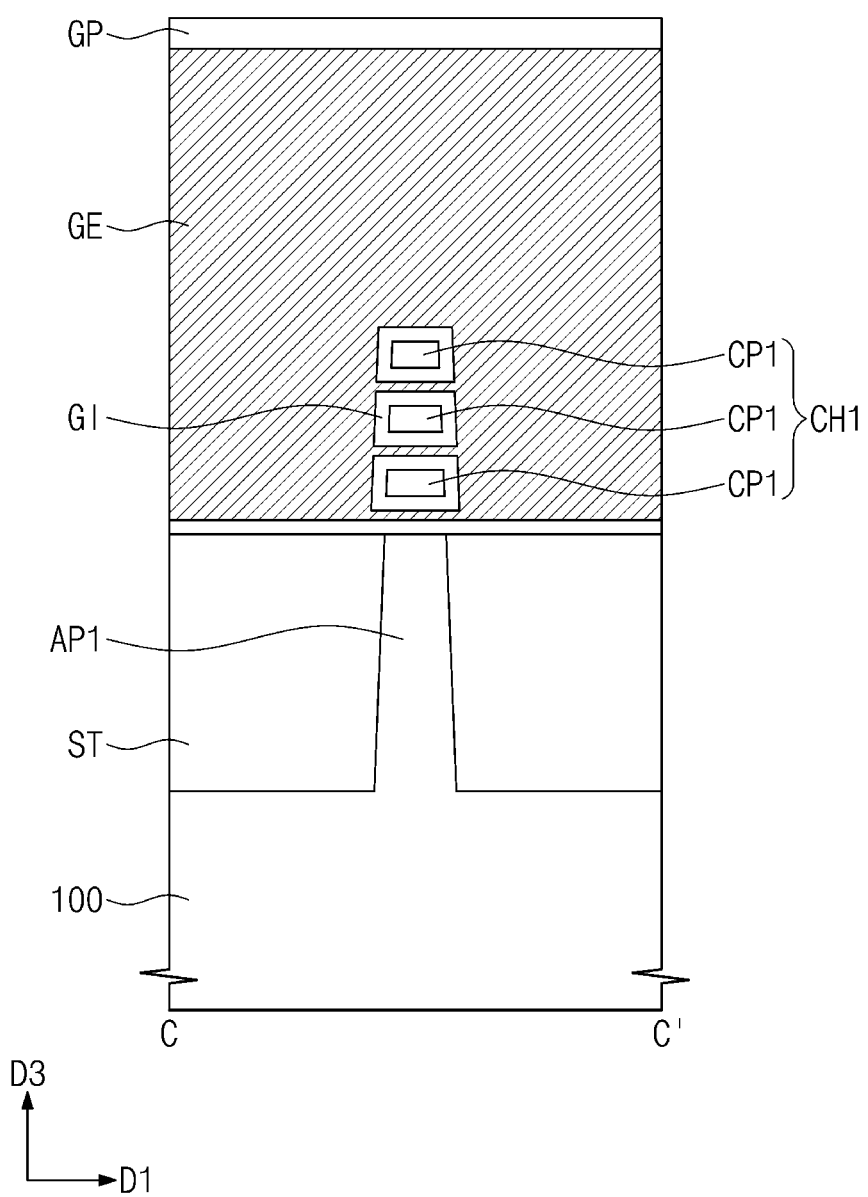
Figure 15C:
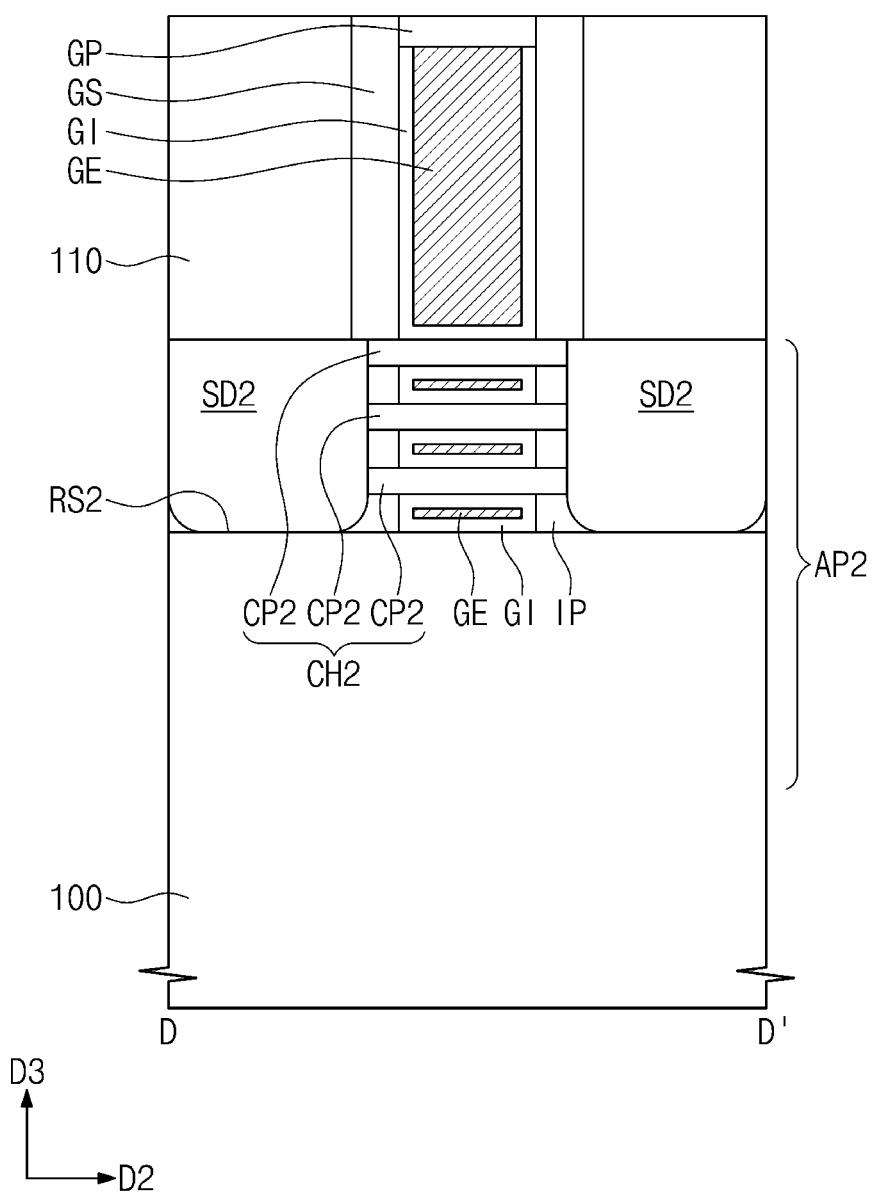
Figure 15D:
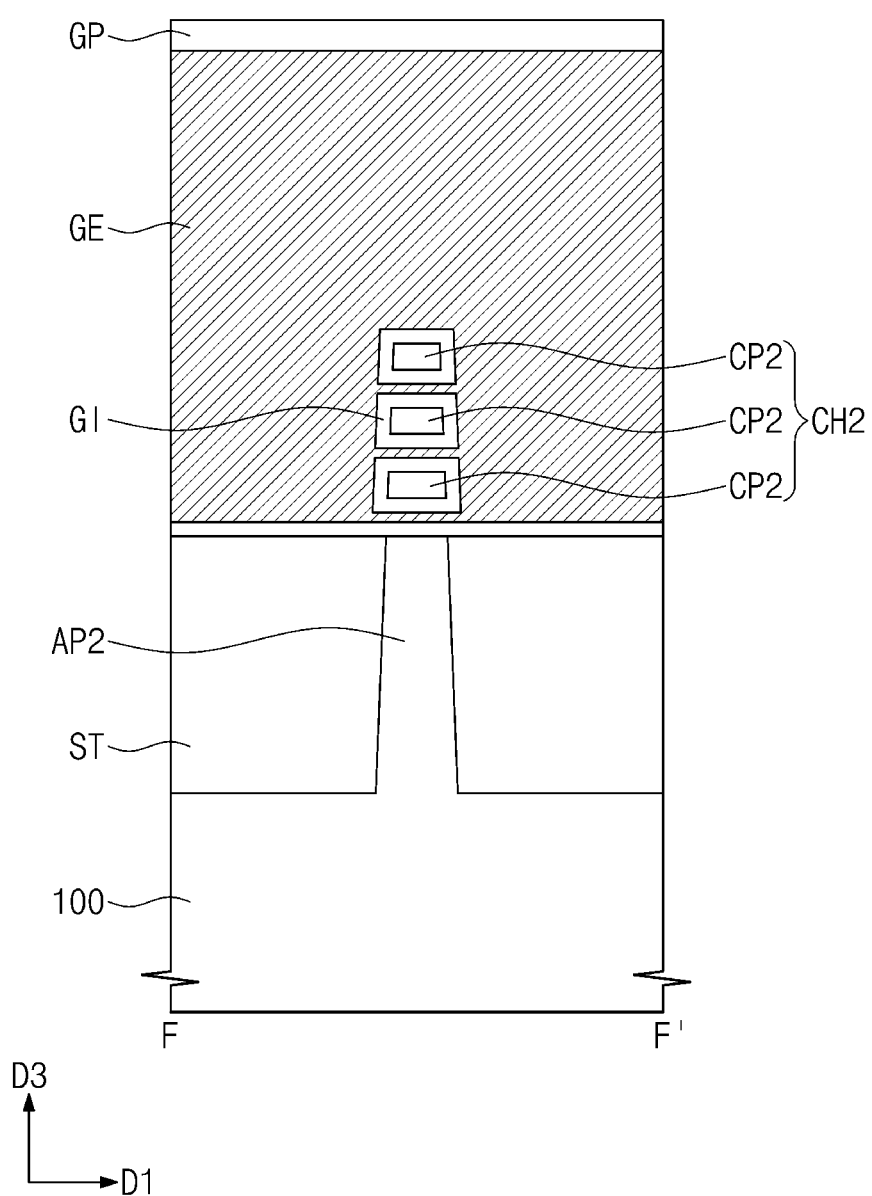

The gate electrode GE on the second active pattern AP2 may surround each of the second channel patterns CP2 (see FIG. 15D). For example, the gate electrode GE on the second active pattern AP2 may surround top and bottom surfaces and opposite sidewalls of each of the second channel patterns CP2. The gate dielectric patterns GI may be interposed between the gate electrode GE and the second channel patterns CP2.

Insulation patterns IP may be interposed between the first source/drain patterns SD1 and the gate electrode GE. The insulation patterns IP may also be interposed between the second source/drain patterns SD2 and the gate electrode GE. The insulation patterns IP may further be interposed between the first channel patterns CP1 vertically separated from each other and between the second channel patterns CP2 vertically separated from each other. The insulation patterns IP may electrically insulate the gate electrodes GE from the first and second source/drain patterns SD1 and SD2. For example, the insulation patterns IP may include a silicon nitride layer.

A detailed shape and description of the first and second source/drain patterns SD1 and SD2 according to the present embodiment may be substantially the same as or similar to that discussed above with reference to FIGS. 1 and 2A to 2F.

It should be noted that items described as contacting each other, or in contact with each other, are directly connected (e.g., touching). Further, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 16:
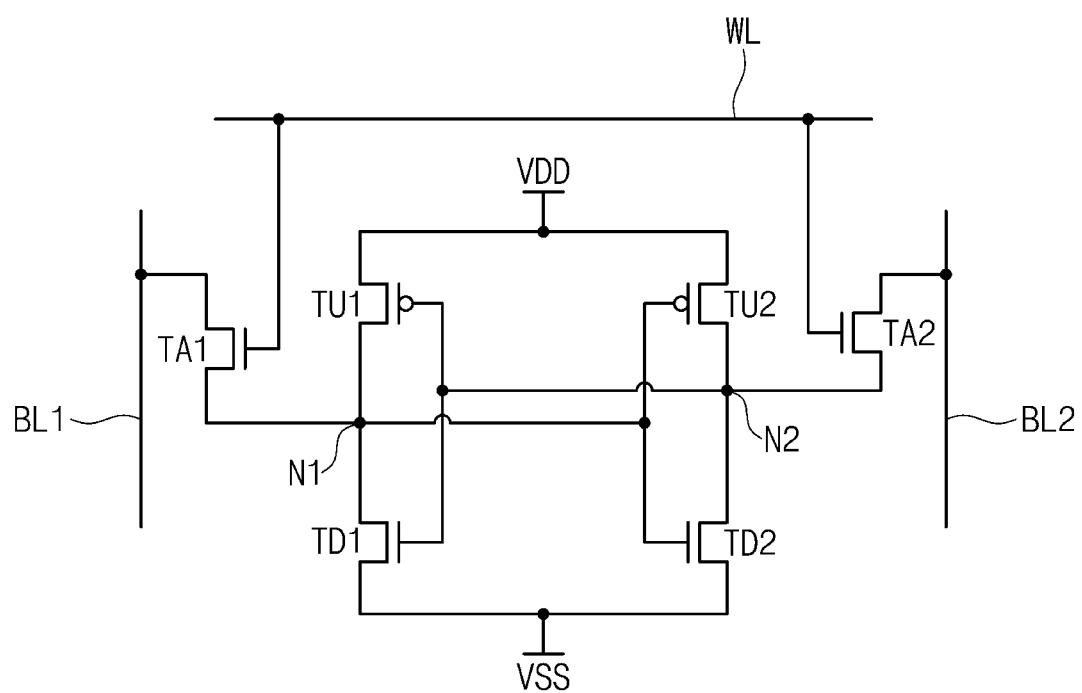
FIG. 16 illustrates an equivalent circuit diagram showing an SRAM cell according to exemplary embodiments.

FIG. 16 illustrates an equivalent circuit diagram showing an SRAM cell according to exemplary embodiments.

Referring to FIG. 16, an SRM cell according to some embodiments may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors. The first and second pull-down transistors TD1 and TD2 and the first and second access transistors TA1 and TA2 may be NMOS transistors.

A first node N1 may be connected to a first source/drain of the first pull-up transistor TU1 and a first source/drain of the first pull-down transistor TD1. A power line VDD may be connected to a second source/drain of the first pull-up transistor TU1, and a ground line VSS may be connected to a second source/drain of the first pull-down transistor TD1. The first pull-up transistor TU1 may have a gate electrically connected to that of the first pull-down transistor TD1. The first pull-up transistor TU1 and the first pull-down transistor TD1 may constitute a first inverter. The first inverter may have an input terminal corresponding to the connected gates of the first pull-up and pull-down transistors TU1 and TD1, and have an output terminal corresponding to the first node N1.

A second node N2 may be connected to a first source/drain of the second pull-up transistor TU2 and a first source/drain of the second pull-down transistor TD2. The power line VDD may be connected to a second source/drain of the second pull-up transistor TU2, and the ground line VSS may be connected to a second source/drain of the second pull-down transistor TD2. The second pull-up and pull-down transistors TU2 and TD2 may have their gates electrically connected to each other. The second pull-up transistor TU2 and the second pull-down transistor TD2 may thus constitute a second inverter. The second inverter may have an input terminal corresponding to the connected gates of the second pull-up and pull-down transistors TU2 and TD2, and have an output terminal corresponding to the second node N2.

The first and second inverters may be connected to each other to constitute a latch structure. In this configuration, the gates of the first pull-up and pull-down transistors TU1 and TD1 may be electrically connected to the second node N2, and the gates of the second pull-up and pull-down transistors TU2 and TD2 may be electrically connected to the first node N1. The first access transistor TA1 may have a first source/drain connected to the first node N1, and have a second source/drain connected to a first bit line BL1. The second access transistor TA2 may have a second source/drain connected to the second node N2, and a second source/drain connected to a second bit line BL2. The first and second access transistors TA1 and TA2 may have their gates electrically connected to a word line WL. The aforementioned configuration may achieve the SRAM cell according to exemplary embodiments of inventive concepts. The various NMOS and PMOS transistors included in the SRAM cell may include the transistor structures described in FIG. 1, 2A-2F, 14A-14B, or 15A-15D.

Figure 17:
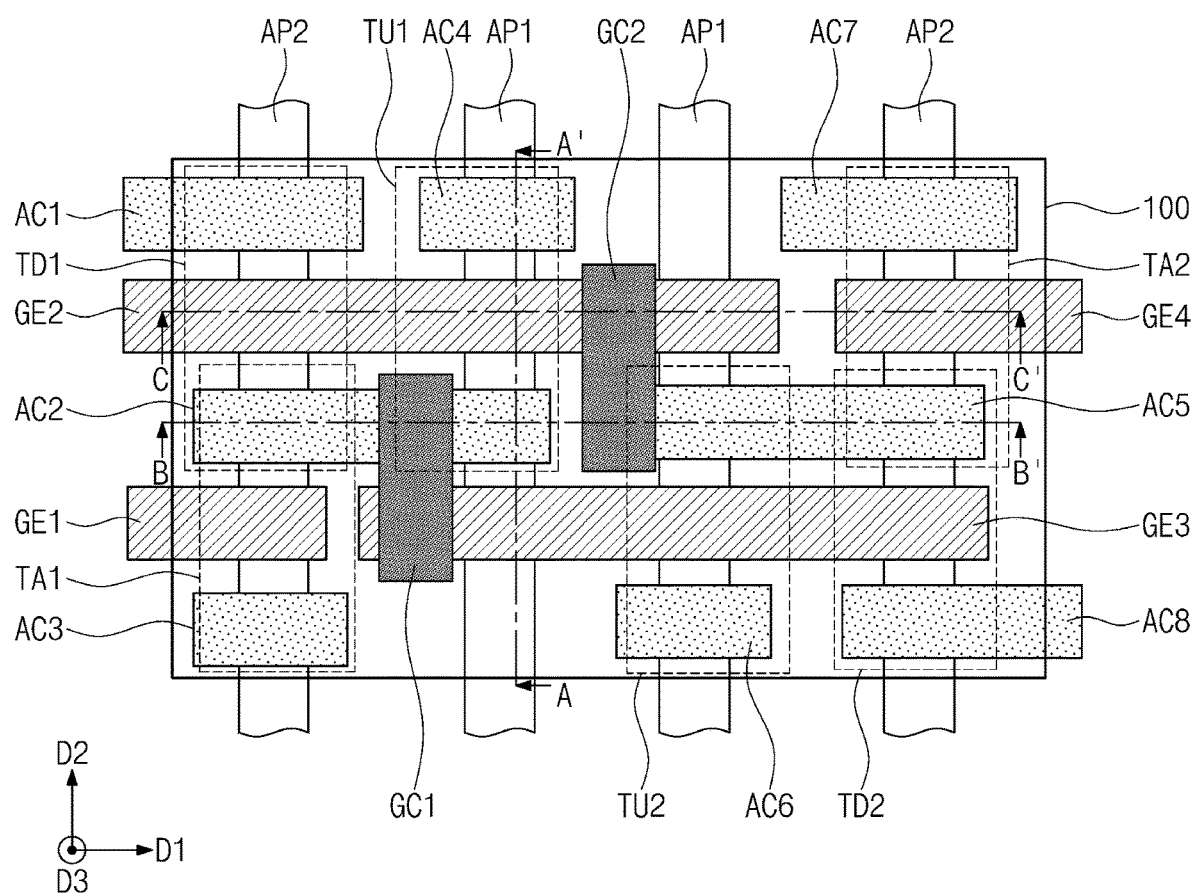
FIG. 17 illustrates a plan view showing an SRAM cell in accordance with the circuit diagram of FIG. 16, showing a semiconductor device according to exemplary embodiments.
Figure 18A:
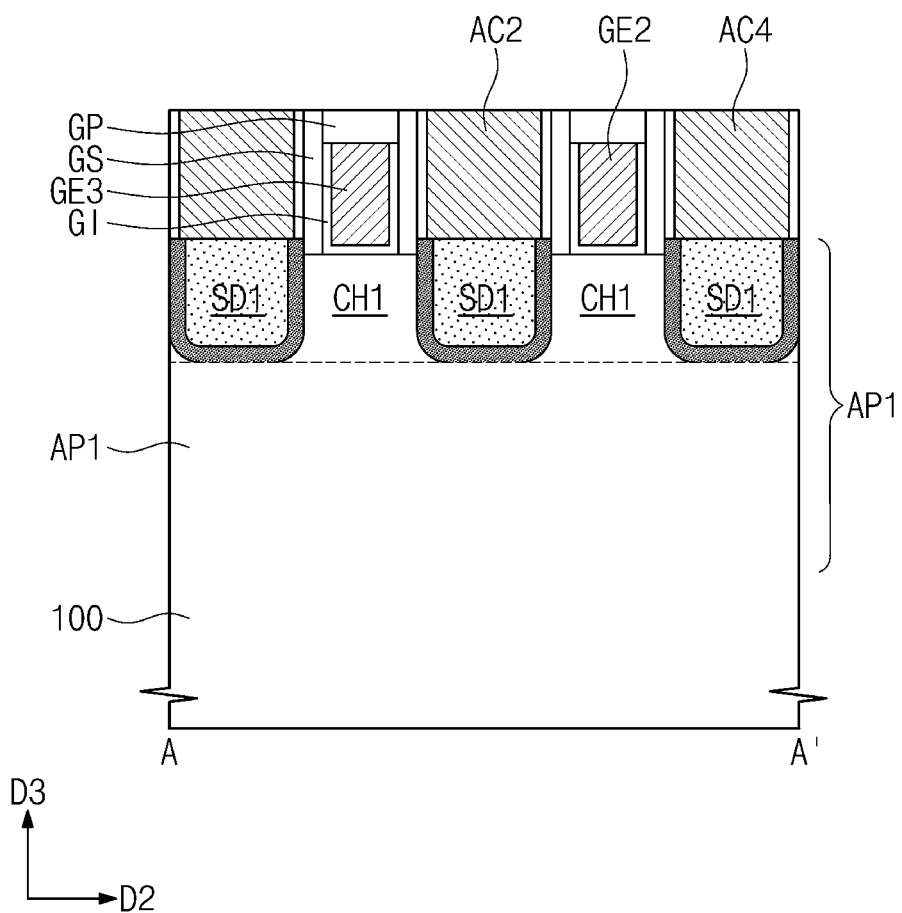
FIGS. 18A to 18C illustrate cross-sectional views respectively taken along lines A-A', B-B', and C-C' of FIG. 17, respectively.
Figure 18B:
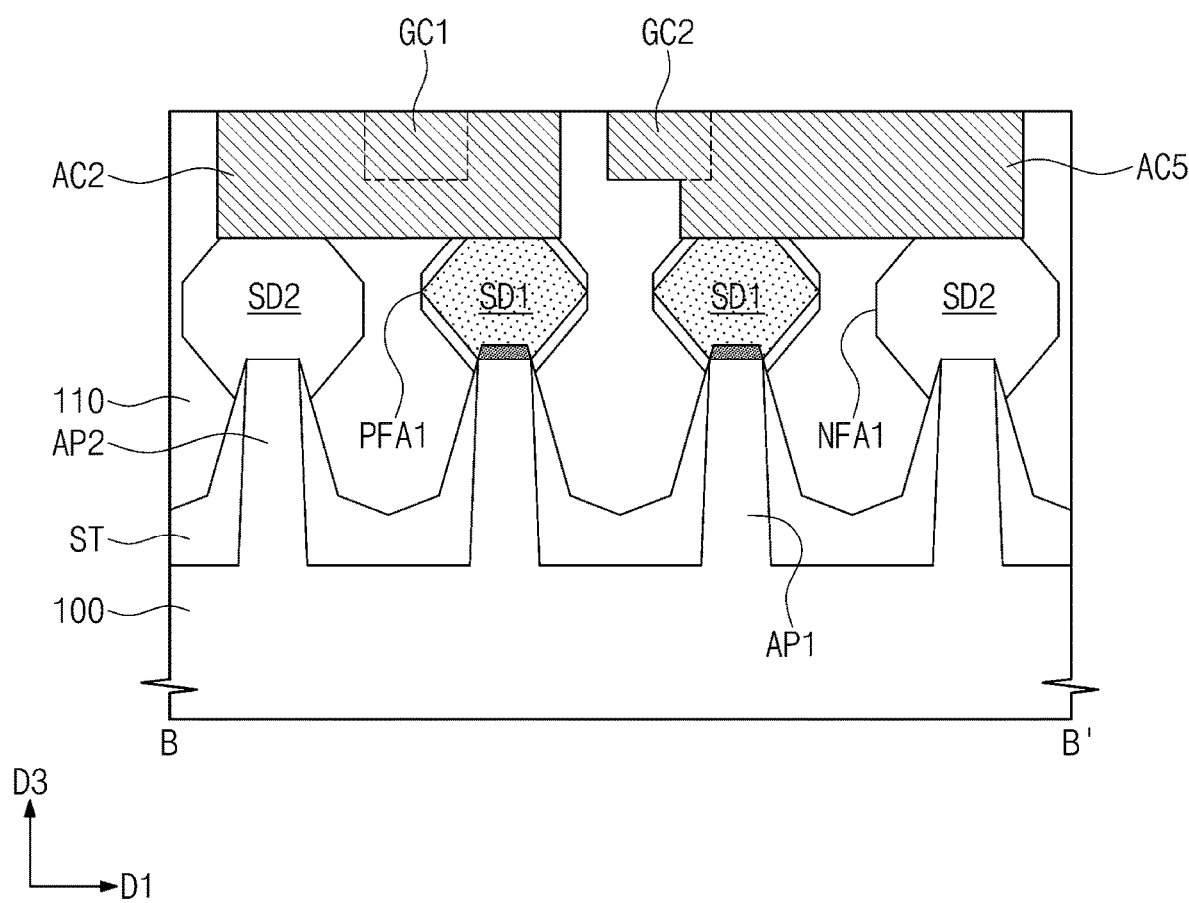
Figure 18C:
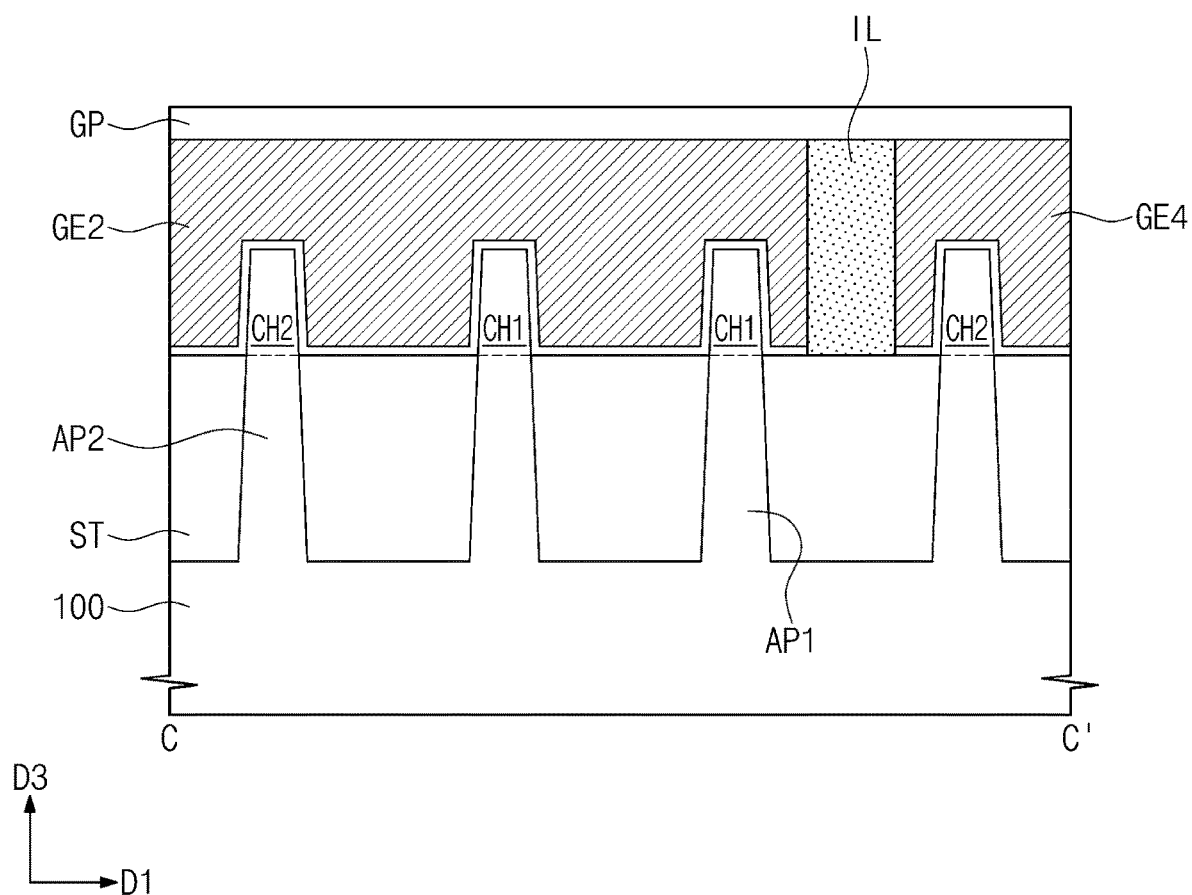

FIG. 17 illustrates a plan view showing an SRAM cell in accordance with the circuit diagram of FIG. 16, showing a semiconductor device according to exemplary embodiments. FIGS. 18A to 18C illustrate cross-sectional views respectively taken along lines A-A', B-B', and C-C' of FIG. 17, respectively. In the embodiment that follows, a detailed description of technical features repetitive to those discussed above with reference to FIGS. 1 and 2A to 2F will be omitted, and a difference thereof will be discussed in detail.

Referring to FIGS. 16, 17, and 18A to 18C, at least one SRAM cell may be provided on a substrate 100. A device isolation layer ST may be provided on the substrate 100. The device isolation layer ST may define first and second active patterns AP1 and AP2.

First channel regions CH1 and first source/drain patterns SD1 may be provided on an upper portion of each of the first active patterns AP1. Second channel regions CH2 and second source/drain patterns SD2 may be provided on an upper portion of each of the second active patterns AP2. The first source/drain patterns SD1 may be p-type impurity regions. The second source/drain patterns SD2 may be n-type impurity regions.

First to fourth gate electrodes GE1 to GE4 may be provided to extend in a first direction D1 while running across the first and second active patterns AP1 and AP2. The second gate electrode GE2 and the fourth gate electrode GE4 may be straightly aligned in the first direction D1. An insulation layer IL may be interposed between the second gate electrode GE2 and the fourth gate electrode GE4, which configuration may separate the second and fourth gate electrodes GE2 and GE4 from each other. The first gate electrode GE2 and the third gate electrode GE3 may be straightly aligned in the first direction D1. An insulation layer IL may be interposed between the first gate electrode GE1 and the third gate electrode GE3, which configuration may separate the first and third gate electrodes GE1 and GE3 from each other.

Active contacts AC1 to AC8 may be provided on opposite sides of the first to fourth gate electrodes GE1 to GE4. The first to eighth active contacts AC1 to AC8 may penetrate an upper portion of first interlayer dielectric layer 110 to come into contact with the first and second source/drain patterns SD1 and SD2. The first to eighth active contacts AC1 to AC8 may have their top surfaces substantially coplanar with that of the first interlayer dielectric layer 110. The first to eighth active contacts AC1 to AC8 may include one or more of conductive metal nitride (e.g., titanium nitride or tantalum nitride) and metal (e.g., titanium, tantalum, tungsten, copper, or aluminum).

A first gate contact GC1 may be provided on the third gate electrode GE3, and a second gate contact GG2 may be provided on the second gate electrode GE2. The first and second gate contacts GC1 and GC2 may penetrate the upper portion of the first interlayer dielectric layer 110, gate spacers GS, and gate capping patterns GP, thereby respectively coupled to the third and second gate electrodes GE3 and GE2. The first and second gate contacts GC1 and GC2 may have their top surfaces substantially coplanar with that of the first interlayer dielectric layer 110. The first and second gate contacts GC1 and GC2 may have their bottom surfaces higher than those of the first to eighth active contacts AC1 to AC8. The first and second gate contacts GC1 and GC2 may include one or more of conductive metal nitride (e.g., titanium nitride or tantalum nitride) and metal (e.g., titanium, tantalum, tungsten, copper, or aluminum). The first and second gate contacts GC1 and GC2 may include the same material as that of the first to eighth active contacts AC1 to AC8. For example, the first gate contact GC1 and the second active contact AC2 may be integrally combined to constitute a single conductive structure. The second gate contact GC2 and the fifth active contact AC5 may be integrally combined to constitute a single conductive structure.

Memory transistors may be constituted or formed by the first and second active patterns AP1 and AP2 and the first to fourth gate electrodes GE1 to GE4. The memory cell transistors shown in FIG. 17 may include the first pull-up transistor TU1, the first pull-down transistor TD1, the second pull-up transistor TU2, the second pull-down transistor TD2, the first access transistor TA1, and the second access transistor TA2, which are discussed above with reference to FIG. 16.

Referring back to FIG. 18B, the second source/drain pattern SD2 of the first pull-down transistor TD1 may be spaced apart in the first direction D1 from the first source/drain pattern SD1 of the first pull-up transistor TU1. The first source/drain pattern SD1 of the first pull-up transistor TU1 may be spaced apart in the first direction D1 from the first source/drain pattern SD1 of the second pull-up transistor TU2. The first source/drain pattern SD1 of the second pull-up transistor TU2 may be spaced apart in the first direction D1 from the second source/drain pattern SD2 of the second pull-down transistor TD2. For example, neighboring source/drain patterns SD1 and SD2 may not contact each other.

Each of the first source/drain patterns SD1 of the first and second pull-up transistors TU1 and TU2 may have a first face PFA1 that faces its adjacent one of the source/drain patterns SD1 and SD2. Each of the second source/drain patterns SD2 of the first and second pull-down transistors TD1 and TD2 may have a first face NFA1 that faces its adjacent one of the source/drain patterns SD1 and SD2. The first face PFA1 of each of the first source/drain patterns SD1 may be perpendicular to a top surface of the substrate 100. The first face NFA1 of each of the second source/drain patterns SD2 may be perpendicular to the top surface of the substrate 100.

In some embodiments, as discussed above with reference to FIGS. 10B and 13, the third semiconductor pattern SP3 may be partially etched to decrease a maximum width of the first source/drain pattern SD1. As discussed above with reference to FIG. 12E, the second source/drain pattern SD2 may be partially etched to have a reduced maximum width. A semiconductor device according to some embodiments may have a margin sufficient enough to separate neighboring source/drain patterns SD1 and SD2 from each other. A semiconductor device according to some embodiments may not include a bridge resulting from direct contact between neighboring source/drain patterns SD1 and SD2.

According to certain embodiments, since a semiconductor device has a margin sufficient enough to separate neighboring source/drain patterns from each other, the semiconductor device may have enhanced electrical characteristics and improved integration.

Although exemplary embodiments have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:

1. A semiconductor device, comprising:
a substrate including a first active pattern vertically protruding from a top surface of the substrate; and
a first source/drain pattern filling a first recess formed on an upper portion of the first active pattern,
wherein the first source/drain pattern comprises:
a first semiconductor pattern; and
a second semiconductor pattern on the first semiconductor pattern,
wherein the first semiconductor pattern has a first face, a second face, and a first corner edge defined where the first face and the second face meet with each other,
wherein the second semiconductor pattern covers the first face and the second face of the first semiconductor pattern and exposes the first corner edge, and
wherein the first corner edge horizontally protrudes in a direction away from a center of the first source/drain pattern.

2. The device of claim 1, wherein the first corner edge, combined with the second semiconductor pattern that covers the first face and the second face of the first semiconductor pattern, forms a first face of the first source/drain pattern, the first face of the first source/drain pattern being perpendicular to the top surface of the substrate.

3. The device of claim 1, wherein:
the first semiconductor pattern has a third face and a second corner edge defined where the second face and the third face meet with each other,
the second semiconductor pattern covers the third face of the first semiconductor pattern and exposes the second corner edge, and
the second corner edge vertically protrudes in a direction away from a center of the first source/drain pattern.

4. The device of claim 1, wherein
the substrate contains a first semiconductor element,
the first source/drain pattern contains a second semiconductor element different from the first semiconductor element, and
the second semiconductor element is included in the first semiconductor pattern and the second semiconductor pattern of the first source/drain pattern, and has a content in the first semiconductor pattern greater than its content in the second semiconductor pattern.

5. The device of claim 4, wherein the first source/drain pattern further comprises a third semiconductor pattern between the first semiconductor pattern and the first recess,
wherein the third semiconductor pattern includes the second semiconductor element, and the second semiconductor element included in the first semiconductor pattern has a content greater than that of the second semiconductor element included in the third semiconductor pattern.

6. The device of claim 1, wherein each of the first and second faces of the first semiconductor pattern is a (111) plane.

7. The device of claim 1, wherein the first source/drain pattern has a first face, a second face, and a third face,
wherein the third face of the first source/drain pattern mutually connects the first and second faces of the first source/drain pattern, and
wherein the first to third faces of the first source/drain pattern are different crystal planes from each other.

8. The device of claim 7, wherein
the first face of the first source/drain pattern is a (110) plane,
the second face of the first source/drain pattern is a (100) plane, and
the third face of the first source/drain pattern is a (111) plane.

9. The device of claim 1, further comprising:
a second active pattern vertically protruding from the top surface of the substrate; and
a second source/drain pattern filling a second recess formed on an upper portion of the second active pattern,
wherein the second source/drain pattern has a first face, a second face, and a third face,
wherein the third face of the second source/drain pattern mutually connects the first and second faces of the second source/drain pattern,
wherein the first to third faces of the second source/drain pattern are different crystal planes from each other, and
wherein the first and second source/drain patterns have different conductivity types from each other.

10. The device of claim 9, wherein the second source/drain pattern consists of a single semiconductor layer.

11. A semiconductor device, comprising:
a substrate including a first active pattern vertically protruding from a top surface of the substrate; and
a first source/drain pattern filling a first recess formed on an upper portion of the first active pattern,
wherein the first source/drain pattern has a first face perpendicular to the top surface of the substrate,
wherein the first source/drain pattern comprises a first semiconductor pattern and a second semiconductor pattern on the first semiconductor pattern,
wherein the first semiconductor pattern comprises a first corner edge horizontally protruding in a direction away from a center of the first source/drain pattern and located between portions of the second semiconductor pattern, and
wherein the first corner edge of the first semiconductor pattern is located at the first face of the first source/drain pattern.

12. The device of claim 11, wherein the first semiconductor pattern further comprises a first face and a second face that define the first corner edge,
wherein the second semiconductor pattern covers the first and second faces of the first semiconductor pattern and exposes the first corner edge of the first semiconductor pattern.

13. The device of claim 11, wherein
the substrate contains a first semiconductor element,
at least the first semiconductor pattern of the first source/drain pattern contains a second semiconductor element different from the first semiconductor element, and
the second semiconductor element contained in the first semiconductor pattern has a content greater than a content of the second semiconductor element contained in the second semiconductor pattern.

14. The device of claim 11, wherein
the first source/drain pattern further has a second face and a third face,
the second face of the first source/drain pattern is parallel to the top surface of the substrate, and
the third face of the first source/drain pattern mutually connects the first and second faces of the first source/drain pattern.

15. The device of claim 11, further comprising:
a second active pattern vertically protruding from the top surface of the substrate; and
a second source/drain pattern filling a second recess formed on an upper portion of the second active pattern,
wherein the second source/drain pattern has a first face perpendicular to the top surface of the substrate, and
wherein the first and second source/drain patterns have different conductivity types from each other.

16. A semiconductor device, comprising:
a substrate including a fin vertically protruding from a top surface of the substrate; and
a source/drain pattern filling a recess formed on an upper portion of the fin,
wherein the source/drain pattern comprises:
a first semiconductor pattern; and
a second semiconductor pattern on the first semiconductor pattern,
wherein the first semiconductor pattern has a first face, a second face, and a first corner edge defined where the first face and the second face meet with each other,
wherein the second semiconductor pattern covers the first face and the second face of the first semiconductor pattern,
wherein the first corner edge horizontally protrudes in a first direction away from a center of the source/drain pattern, and wherein the source/drain pattern has a maximum width in the first direction at a level of the first corner edge, and wherein the maximum width of the source/drain pattern is the same as a maximum width in the first direction of the first semiconductor pattern.

17. The device of claim 16, wherein the first corner edge, combined with the second semiconductor pattern that covers the first face and the second face of the first semiconductor pattern, forms a first face of the source/drain pattern, the first face of the source/drain pattern being perpendicular to the top surface of the substrate.

18. The device of claim 16, wherein:

the first semiconductor pattern has a third face and a second corner edge defined where the second face and the third face meet with each other, the second semiconductor pattern covers the third face of the first semiconductor pattern and exposes the second corner edge, and the second corner edge vertically protrudes in a second direction away from a center of the source/drain pattern.

19. The device of claim 16, wherein the substrate contains a first semiconductor element, the source/drain pattern contains a second semiconductor element different from the first semiconductor element, and the second semiconductor element is included in the first semiconductor pattern and the second semiconductor pattern of the source/drain pattern, and has a content in the first semiconductor pattern greater than its content in the second semiconductor pattern.

20. The device of claim 19, wherein the source/drain pattern further comprises a third semiconductor pattern between the first semiconductor pattern and the recess, wherein the third semiconductor pattern includes the second semiconductor element, and the second semiconductor element included in the first semiconductor pattern has a content greater than that of the second semiconductor element included in the third semiconductor pattern.

* * * * *